(12) United States Patent
Saito et al.

(10) Patent No.: US 7,119,410 B2
(45) Date of Patent: Oct. 10, 2006

(54) MAGNETO-RESISTIVE EFFECT ELEMENT AND MAGNETIC MEMORY

(75) Inventors: Yoshiaki Saito, Kanagawa-ken (JP); Hideyuki Sugiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 10/901,325

(22) Filed: Jul. 29, 2004

(65) Prior Publication Data

US 2005/0057960 A1 Mar. 17, 2005

(30) Foreign Application Priority Data

Jul. 30, 2003 (JP) ............................. 2003-203783

(51) Int. Cl.
*H01L 29/82* (2006.01)
(52) U.S. Cl. ...................................... 257/422; 365/158
(58) Field of Classification Search ................ 257/295, 257/421, 422, 427; 438/3, 48, 73; 365/158, 365/171, 173
See application file for complete search history.

(56) References Cited

U.S. PATENT DOCUMENTS

| 6,256,223 | B1 | 7/2001 | Sun |
| 6,611,405 | B1 | 8/2003 | Inomata et al. |
| 6,714,444 | B1 | 3/2004 | Huai et al. |
| 6,751,074 | B1 | 6/2004 | Inomata et al. |
| 6,826,078 | B1 * | 11/2004 | Nishiyama et al. ......... 365/158 |
| 6,987,653 | B1 | 1/2006 | Inomata et al. |
| 2005/0057960 | A1 | 3/2005 | Saito et al. |
| 2005/0185347 | A1 | 8/2005 | Inomate et al. |

FOREIGN PATENT DOCUMENTS

| JP | 2001-156357 | 6/2001 |
| JP | 2001-236781 | 8/2001 |
| JP | 2002-270921 | 9/2002 |

OTHER PUBLICATIONS

U.S. Appl. No. 11/242,906, filed Oct. 5, 2005, Saito et al.
U.S. Appl. No. 11/255,101, filed Oct. 21, 2005, Saito et al.
U.S. Appl. No. 11/228,326, filed Sep. 19, 2005, Inokuchi et al.
L. Berger, "Multilayers as Spin-Wave Emiting Diodes", J. Appl. Phys. 81, Apr. 15, 1997, pp. 4880-4882.
J.C. Slonczewski, "Excitation of Spin Waves by an Electric Current", Journal of Magnetism and Magnetic Materials 195 (1999) L261-L268.

(Continued)

Primary Examiner—David Vu
(74) Attorney, Agent, or Firm—Oblon, Spivak, McClelland, Maier & Neustadt, P.C.

(57) ABSTRACT

It is possible to perform a writing operation with low power consumption and a low current, and enhance reliability without causing element breakdown. There are provided a first magnetization-pinned layer including at least one magnetic film in which a magnetization direction is pinned; a second magnetization-pinned layer including at least one magnetic film in which a magnetization direction is pinned; a magnetic recording layer formed between the first magnetization-pinned layer and the second magnetization-pinned layer and including at least one magnetic film in which a magnetization direction is changeable by injecting spin-polarized electrons; a tunnel barrier layer formed between the first magnetization-pinned layer and the magnetic recording layer; and a nonmagnetic intermediate layer formed between the magnetic recording layer and the second magnetization-pinned layer. The magnetization direction of the magnetic film of the first magnetization-pinned layer on the magnetic recording layer side is substantially antiparallel to the magnetization direction of the magnetic film of the second magnetization-pinned layer on the magnetic recording layer side.

62 Claims, 18 Drawing Sheets

OTHER PUBLICATIONS

L. Berger, "Emission of Spin Waves by a Magnetic Multilayer traversed by a Current", Physical Review B, vol. 54, No. 13, Oct. 1, 1996, pp. 9353-9356.

J.C. Slonczewski, "Current-Driven Excitation of Magnetic Multilayer", Journal of Magnetism and Magnetic Materials 159 (1996) L1-L7.

* cited by examiner

"0"
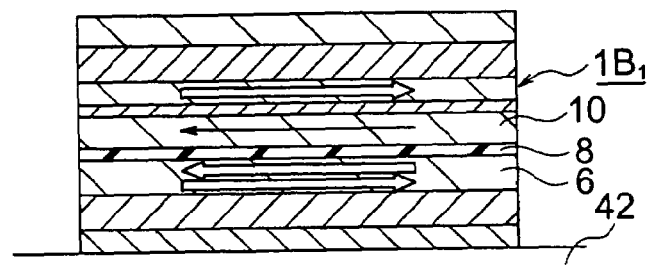
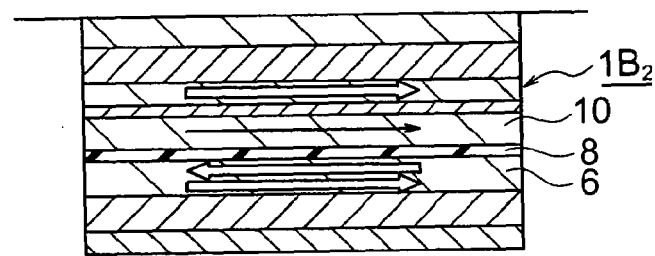
FIG. 14
"1"
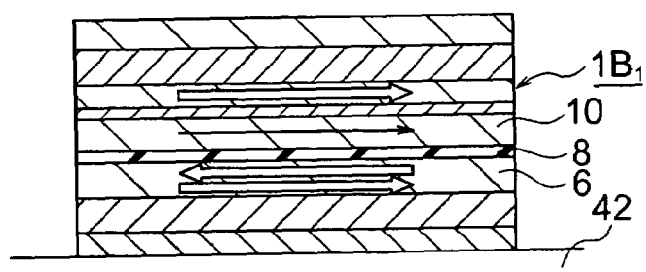
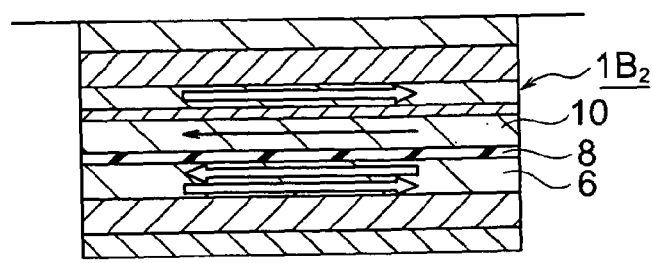
FIG. 15

MAGNETO-RESISTIVE EFFECT ELEMENT AND MAGNETIC MEMORY

CROSS-REFERENCE TO RELATED APPLICATION

This application is based upon and claims the benefit of priority from prior Japanese Patent Application No. 2003-203783, filed on Jul. 30, 2003 in Japan, the entire contents of which are incorporated herein by reference.

BACKGROUND OF THE INVENTION

1. Field of the Invention

The present invention relates to a magneto-resistive effect element and a magnetic memory.

2. Related Art

A magneto-resistive effect element having magnetic films is used for a magnetic head, a magnetic sensor and so forth, and it has been proposed to be used for a solid magnetic memory (magneto-resistive effect memory: MRAM (Magnetic Random Access Memory)).

In recent years, a ferromagnetic tunnel junction element or the so-called "tunneling magneto-resistive element (TMR element)" has been proposed as a magneto-resistive effect element utilizing a tunnel current and having a sandwiching structure where one dielectric is inserted between two ferromagnetic metal layers, and a current is caused to flow perpendicular to a film face to utilize a tunneling current. In the tunneling magneto-resistive element, since a magneto-resistance change ratio (MR ratio) has reached 20% or more, a possibility of the MRAM to public application is increasing.

The TMR element is realized by the following method. That is, after a thin AL (aluminum) layer having a thickness of 0.6 nm to 2.0 nm is formed on a ferromagnetic electrode, and the surface of the Al layer is exposed to oxygen glow discharge or an oxygen gas to form a tunnel barrier layer consisting of $Al_2O_3$.

Further, a ferromagnetic single tunnel junction having a structure where a magnetization direction of one of ferromagnetic layers constituting the ferromagnetic single tunnel junction is pinned by an anti-ferromagnetic layer has been proposed.

Further a ferromagnetic tunnel junction obtained through magnetic particles diffused in a dielectric material and a ferromagnetic dual tunnel junction have been also proposed.

In view of the fact that a magneto-resistance change ratio in a range of 20% to 50% have been also achieved in these tunneling magneto-resistive elements and the fact that reduction in magneto-resistance change ratio can be suppressed even if a voltage value to be applied to a tunneling magneto-resistive element is increased in order to obtain a desired output voltage value, there is a possibility of the TMR element to application to the MRAM.

A magnetic recording element using the ferromagnetic single tunnel junction or the ferromagnetic dual tunnel junction is nonvolatile and has a short write/read time of 10 ns or less and potential, i.e., can be rewritten $10^{15}$ or more. In particular, in a magnetic recording element using a ferromagnetic dual tunnel junction, as described above, a decrease in magneto-resistance change ratio can be suppressed even though a voltage applied to the ferromagnetic tunnel junction element is increased to obtain a desired large output voltage, and preferable characteristic for a magnetic recording element can be achieved.

However, regarding a cell size of the memory, when an architecture where a cell is constituted by one transistor and one TMR element is used, it is disadvantageously impossible to make a memory cell size smaller than the size of a semiconductor DRAM (Dynamic Random Access Memory).

In order to solve the above problem, a diode architecture in which a TMR element and a diode are serially connected between a bit line and a word line and a simple matrix architecture in which a TMR element is arranged between a bit line and a word line are proposed.

However, since change of magnetization direction of a storage layer is performed by a magnetic field produced by a current pulse in both cases when a data is written in the storage layer, a power consumption is large, and a large capacity cannot be achieved because a wiring layer has an allowable current density limit when the capacity of the memory is increased. The area of a driver for causing a current to flow becomes large only when the absolute value of a flowing current is 1 mA or less or, if the memory is replaced with a DRAM, 2 mA or less. In comparison with another nonvolatile solid-state magnetic memory, e.g., a ferroelectric memory (Ferroelectric Random Access Memory) or a flash memory using a ferroelectric capacitor, a chip size increases to spoil the competitiveness.

With respect to the problem, a solid-state magnetic storage device in which thin film consisting of a high-permeability magnetic material is formed around write wiring layer is proposed. According to this magnetic storage device, since the high-permeability magnetic film is formed around the wiring layer, current value required to write information in magnetic recording layer can be efficiently reduced.

However, even though this device is used, it is very difficult to make a current for writing data 1 mA or less.

In order to solve the above problem, a write method using a spin-injection method is proposed (see the specification disclosed in U.S. Pat. No. 6,256,223, Phys. Rev. B54.9353 (1996), and J. Magn. Magn. Mat.159, L1 (1996)). It is observed that spins are inverted by injection of a spin-polarized current. However, when the spin injection method is applied to a spin tunnel element, a problem that causes element breakdown such as breakdown of the tunnel insulating film arises, and the device has a problem with reliability. A new element structure, a new memory structure, and a new architecture in which, even though data is written by using the spin injection method, a current density in writing performed not to cause element breakdown is decreased and high-speed reading can be achieved must be proposed.

As described above, a new element structure and a new architecture are required to realize a magnetic memory which can operate with low power consumption, which can write data with a low current, which is free from element breakdown, and which has high reliability and a high read speed.

SUMMARY OF THE INVENTION

The present invention has been made on the basis of the recognition of the above problems, has as its object to provide a magneto-resistive effect element which can operate with low power consumption, which can write data with a low current, which is free from element breakdown, and which has high reliability and a magnetic memory using the magneto-resistive effect element.

A magneto-resistive effect element according to a first aspect of the present invention includes: a first magnetization-pinned layer including at least one magnetic film in which a magnetization direction is pinned; a second magnetization-pinned layer including at least one magnetic film in which a magnetization direction is pinned; a magnetic recording layer formed between the first magnetization-pinned layer and the second magnetization-pinned layer and including at least one magnetic film in which a magnetization direction is changeable by injecting spin-polarized electrons; a tunnel barrier layer formed between the first magnetization-pinned layer and the magnetic recording layer; and a nonmagnetic intermediate layer formed between the magnetic recording layer and the second magnetization-pinned layer, the magnetization direction of the magnetic film of the first magnetization-pinned layer on the magnetic recording layer side being substantially anti-parallel to the magnetization direction of the magnetic film of the second magnetization-pinned layer on the magnetic recording layer side.

A magnetic memory according to a second aspect of the present invention includes: a memory cell including a magneto-resistive effect element including a first magnetization-pinned layer having at least one magnetic film in which a magnetization direction is pinned, a second magnetization-pinned layer having at least one magnetic film in which a magnetization direction is pinned, a magnetic recording layer formed between the first magnetization-pinned layer and the second magnetization-pinned layer and having at least one magnetic film in which a magnetization direction is changeable by injecting spin-polarized electrons, a tunnel barrier layer formed between the first magnetization-pinned layer and the magnetic recording layer, and a nonmagnetic intermediate layer formed between the magnetic recording layer and the second magnetization-pinned layer, the magnetization direction of the magnetic film of the first magnetization-pinned layer on the magnetic recording layer side being substantially anti-parallel to the magnetization direction of the magnetic film of the second magnetization-pinned layer on the magnetic recording layer side, and a first wiring to which one end of the magneto-resistive effect element is electrically connected; and a second wiring to which the other end of the magneto-resistive effect element is electrically connected.

A magnetic memory according to a third aspect of the present invention includes: a first wiring; a first magneto-resistive effect element including a first magnetization-pinned layer having at least one magnetic film in which a magnetization direction is pinned, a second magnetization-pinned layer having at least one magnetic film in which a magnetization direction is pinned, a first magnetic recording layer formed between the first magnetization-pinned layer and the second magnetization-pinned layer and having at least one magnetic film in which a magnetization direction is changeable by injecting spin-polarized electrons, a first tunnel barrier layer formed between the first magnetization-pinned layer and the first magnetic recording layer, and a first nonmagnetic intermediate layer formed between the first magnetic recording layer and the second magnetization-pinned layer, one end of the first magneto-resistive effect element being connected to the first wiring, and the magnetization direction of the magnetic film of the first magnetization-pinned layer on the first magnetic recording layer side being substantially anti-parallel to the magnetization direction of the magnetic film of the second magnetization-pinned layer on the first magnetic recording layer side; a second magneto-resistive effect element including a third magnetization-pinned layer having at least one magnetic film in which a magnetization direction is pinned, a fourth magnetization-pinned layer having at least one magnetic film in which a magnetization direction is pinned, a second magnetic recording layer formed between the third magnetization-pinned layer and the fourth magnetization-pinned layer and having at least one magnetic film in which a magnetization direction is changeable by injecting spin-polarized electrons, a second tunnel barrier layer formed between the third magnetization-pinned layer and the second magnetic recording layer, and a second nonmagnetic intermediate layer formed between the second magnetic recording layer and the fourth magnetization-pinned layer, one end of the second magneto-resistive effect element being connected to the first wiring, and the magnetization direction of the magnetic film of the third magnetization-pinned layer on the second magnetic recording layer side being substantially anti-parallel to the magnetization direction of the magnetic film of the fourth magnetization-pinned layer on the second magnetic recording layer side; a selective transistor one of the source and the drain of which is connected to the first wiring; a second wiring electrically connected to the other end of the first magneto-resistive effect element; and a third wiring electrically connected to the other end of the second magneto-resistive effect element.

BRIEF DESCRIPTION OF THE DRAWINGS

FIG. 14 is a sectional view showing directions of spins of a magneto-resistive effect element when the memory cell of the magnetic memory according to the eighth embodiment of the present invention stores "0".

FIG. 15 is a sectional view showing directions of spins of the magneto-resistive effect element when the memory cell of the magnetic memory according to the eighth embodiment of the present invention stores "1".

DETAILED DESCRIPTION OF THE INVENTION

Embodiments of the present invention will be described below with reference to the accompanying drawings.

(First Embodiment)

Figure 1:
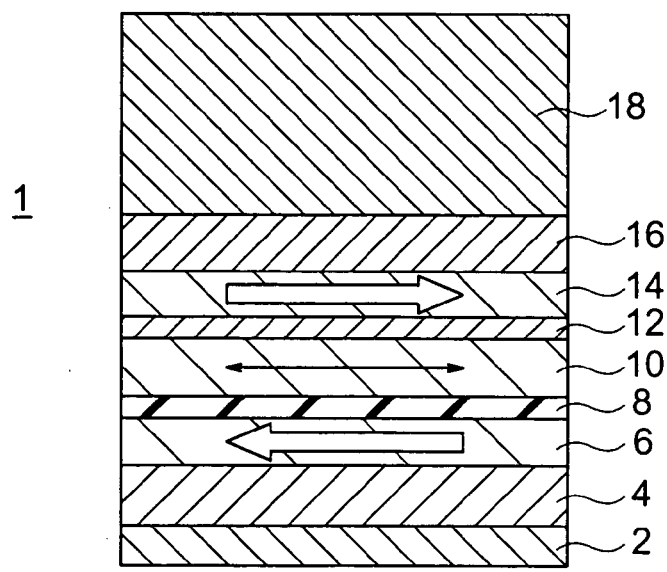
FIG. 1 is a sectional view showing the configuration of a magneto-resistive effect element according to a first embodiment of the present invention.

The configuration of a magneto-resistive effect element according to a first embodiment of the present invention is shown in FIG. 1. A magneto-resistive effect element 1 according to this embodiment comprises an anti-ferromagnetic layer 4 formed on an underlying layer 2, a magnetization-pinned layer 6 including a magnetic layer which is formed on the anti-ferromagnetic layer 4 and in which the direction of magnetization (spins) is pinned, a tunnel barrier layer 8, a magnetic recording layer 10 including a magnetic layer which formed on the tunnel barrier layer 8 and in which the direction of magnetization can be changed, a nonmagnetic metal layer 12 formed on the magnetic recording layer 10, a magnetization-pinned layer 14 including a magnetic layer which is formed on the nonmagnetic metal layer 12 and in which the direction of magnetization is pinned, an anti-ferromagnetic layer 16 formed on the magnetization-pinned layer 14, and a metal hard mask 18 formed on the anti-ferromagnetic layer 16.

The direction of magnetization of the magnetization-pinned layer 6 is pinned by exchange coupling force between the magnetization-pinned layer 6 and the anti-ferromagnetic layer 4, and the direction of magnetization of the magnetization-pinned layer 14 is pinned by exchange coupling force between the magnetization-pinned layer 14 and the anti-ferromagnetic layer 16, so that the directions of magnetization of the magnetization-pinned layer 6 and the magnetization-pinned layer 14 are different from each other by about 180°.

Spin injection is performed to the magneto-resistive effect element 1 having the above configuration to make it possible to write "1" and "0". The present inventors found that a current for writing data in the magneto-resistive effect element 1 could be made smaller than that of a spin-injection writing operation of a conventional tunnel junction element.

In general, spin-injection writing principles of an ordinal GMR element in which a magnetization-pinned layer, a nonmagnetic layer, and a magnetic recording layer are laminated and a ordinal tunnel junction element in which a magnetization-pinned layer, a tunnel barrier layer, and a magnetic recording layer are laminated will be described below.

a) When the spin moments of a magnetization-pinned layer and a magnetic recording layer are subjected to spin inversion from anti-parallel to parallel;

electrons are injected from the magnetization-pinned layer side, electrons spin-polarized in the magnetization-pinned layer tunnel through a tunnel barrier layer (or nonmagnetic layer) to cause spin torque to operate on the magnetic recording layer, and the spins of the magnetic recording layer are inverted from anti-parallel to parallel.

b) When the spin moments of the magnetization-pinned layer and the magnetic recording layer are subjected to spin inversion from parallel to anti-parallel;

electrons are injected from the magnetic recording layer side, and electrons spin-polarized in the magnetic recording layer tunnel through the tunnel barrier layer. At this time, electrons having the same spin direction as the spin direction of the magnetization-pinned layer easily tunnel through the tunnel barrier layer with high probability. However, electrons having anti-parallel spins are reflected. The electrons reflected to the magnetic recording layer to cause spin torque to operate on the magnetic recording layer, and the spins in the magnetic recording layer are inverted from parallel to anti-parallel.

A current required at this time can be expressed by the following equations:

in case of anti-parallel→parallel;

$$Ic^P = e\alpha MA_t(H - H_k - 2\pi M)/hg(\pi)$$

in case of parallel→anti-parallel;

$$Ic_{AP} = e\alpha MA_t(H + H_k + 2\pi M)/hg(0).$$

where e is an elementary electric charge, α is Gilbert damping parameter, M is magnetization, $A_t$ is the volume of a magnetic recording layer, H is a value of a magnetic field, $H_k$ is an anisotropic constant, and h is a Plank constant. Reference symbol g(π) denotes spin dependence on an interface between the magnetization-pinned layer and the nonmagnetic layer, which is given by the following equation:

$$g(\theta) = (-4 + (1+p)^3(3+\cos\theta)/4p^{3/2})^{-1}$$

where p is a spin polarization rate. According to this equation, since g(π)>g(0) is satisfied, a current $Ic^P$ obtained by spin inversion from anti-parallel→parallel is smaller than a current $Ic_{AP}$ obtained by spin inversion from parallel to anti-parallel.

In contrast to this, the magneto-resistive effect element 1 according to the embodiment has the following configuration. That is, the magnetization-pinned layer 6 is formed on one side of the magnetic recording layer 10 through a tunnel barrier layer 8, and the magnetization-pinned layer 14 is formed on the other side through the nonmagnetic metal layer 12, so that the magnetic recording layer 10 is interposed between the magnetization-pinned layer 6 and the magnetization-pinned layer 14.

For this reason, in the present embodiment, resistances between the magnetization-pinned layer 6, the tunnel barrier layer 8, and the magnetic recording layer 10 are higher than resistances between the magnetic recording layer 10, the nonmagnetic metal layer 12, and the magnetization-pinned layer 14, and changes of the resistances are dependent on the relative directions of spins between the magnetization-pinned layer 6, the tunnel barrier layer 8, and the magnetic recording layer 10.

In the present embodiment, when the spin moments between the magnetization-pinned layer 6, the tunnel barrier layer 8, and the magnetic recording layer 10 are spin-inverted from anti-parallel to parallel, and when electrons are injected from the magnetization-pinned layer 6 side to the magnetic recording layer 10, electrons spin-polarized by the magnetization-pinned layer 6 tunnel through the tunnel barrier layer 8 to cause spin torque to operate on the magnetic recording layer 10. At this time, since the spin-polarized electrons flow from the magnetic recording layer 10 to the magnetization-pinned layer 14 through the non-magnetic metal layer 12, the spin moments of the magnetization-pinned layer 14 and the magnetic recording layer 10 are parallel to each other while the spins of the magnetic recording layer 10 are anti-parallel to the spins of the magnetization-pinned layer 6. For this reason, spin electrons reflected by the magnetization-pinned layer 14 also causes spin torque to operate on the magnetic recording layer 10, and the spins of the magnetic recording layer 10 are inverted from anti-parallel to parallel with respect to the spins of the magnetization-pinned layer 6. The two spin torques make the current of spin injection considerably smaller than the current of spin injection of an ordinal tunnel junction element.

In the present embodiment, when the spin moments between the magnetization-pinned layer 6, the tunnel barrier layer 8, and the magnetic recording layer 10 are spin-inverted from parallel to anti-parallel, and when electrons are injected from the magnetization-pinned layer 14 to the magnetic recording layer 10, electrons spin-polarized by the magnetization-pinned layer 14 flow into the magnetic recording layer 10 through the nonmagnetic metal layer 12 to cause spin torque to operate on the magnetic recording layer 10. At this time, the spin-polarized electrons tend to tunnel through the tunnel barrier layer 8 to flow into the magnetization-pinned layer 6. However, when the electrons tunnel through the tunnel barrier layer 8, electrons having the same spin direction as the spin direction of the magnetization-pinned layer 6 easily tunnel through the tunnel barrier layer 8 with high probability, but electrons of anti-parallel spins are reflected. Electrons reflected to the magnetic recording layer 10 cause spin torque to operate on the magnetic recording layer 10. The two spin torques inverts the spins of the magnetic recording layer from parallel to anti-parallel with respect to the spins of the magnetization-pinned layer 6.

Therefore, when spin injection is performed to the magneto-resistive effect element according to the embodiment, "1" and "0" can be written with low power consumption, and a current for writing data can be made smaller than a current for writing data used when data is written in an ordinal tunnel junction element by spin injection. For this reason, dielectric breakdown of the tunnel barrier layer can be prevented in writing, and a high-reliable magneto-resistive effect element can be obtained.

In the first embodiment, the nonmagnetic metal layer 12 can be replaced with a tunnel barrier layer. In this case, the resistances of the two tunnel barrier layers can be designed to be different from each other. The materials and/or the film thicknesses of these layers are appropriately selected to control the resistances.

In the embodiment, the spin directions of the magnetization-pinned layer 6 and the magnetization-pinned layer 14 are different from each other by 180°. In order to realize the spin directions, anti-ferromagnetic layers having different Neel temperatures must be used. For this reason, in the present embodiment, the anti-ferromagnetic layers 4 and 16 are designed to have different Neel temperatures.

One of the two magnetization-pinned layers 6 and 14 has a three-layer laminated structure constituted by a magnetic layer, a nonmagnetic layer, and a magnetic layer to make it possible to easily make the spin directions of the magnetization-pinned layer 6 and the magnetization-pinned layer 14 different from each other by about 180°. The magneto-resistive effect element using the magnetization-pinned layer 14 having the three-layer laminated structure constituted by a magnetic layer, a nonmagnetic layer, and a magnetic layer will be described as the second embodiment below.

(Second Embodiment)

Figure 2:
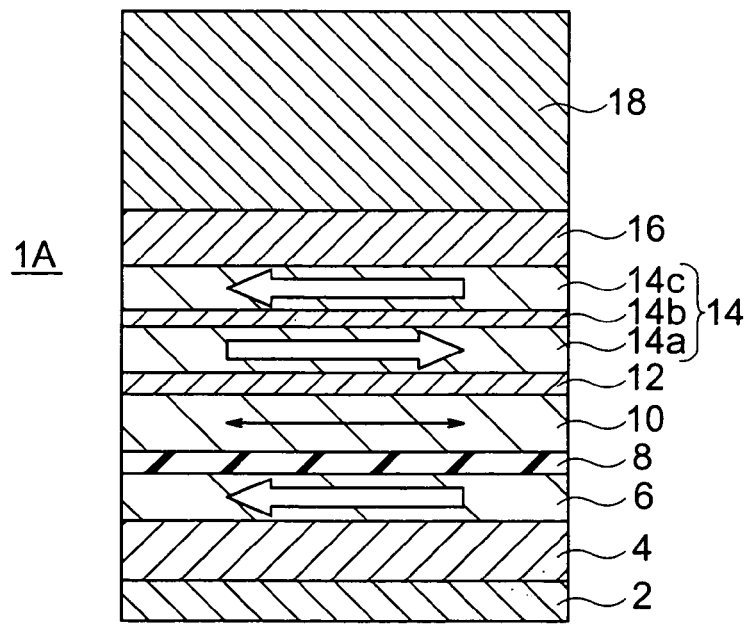
FIG. 2 is a sectional view showing the configuration of a magneto-resistive effect element according to a second embodiment of the present invention.

The configuration of a magneto-resistive effect element according to a second embodiment of the present invention is shown in FIG. 2. A magneto-resistive effect element 1A is obtained such that the magnetization-pinned layer 14 has a three-layer laminated structure constituted by a magnetic layer 14a, a nonmagnetic layer 14b, and a magnetic layer 14c in the magneto-resistive effect element 1 according to the first embodiment shown in FIG. 1. In this case, as shown in FIG. 2, the spin direction of the magnetic layer 14a close to the magnetic recording layer 10 is pinned to be a direction opposing the spin direction of the magnetization-pinned layer 6.

In the magneto-resistive effect element 1A according to the second embodiment, the spin direction of the magnetic layer 14a close to the magnetic recording layer 10 is pinned to be the direction opposing the spin direction of the magnetization-pinned layer 6. For this reason, the magneto-resistive effect element 1B has the same configuration as that of the magneto-resistive effect element 1 according to the first embodiment. As in the first embodiment, "1" and "0" can be written with low power consumption by spin injection, and a current for writing data can be made smaller than that of writing by spin injection in an ordinal tunnel junction element. For this reason, dielectric breakdown of the tunnel barrier layer can be prevented in writing, and a high-reliable magneto-resistive effect element can be obtained.

In the embodiment, as in the first embodiment, the nonmagnetic metal layer 12 can be replaced with a tunnel barrier layer.

(Third Embodiment)

Figure 3:
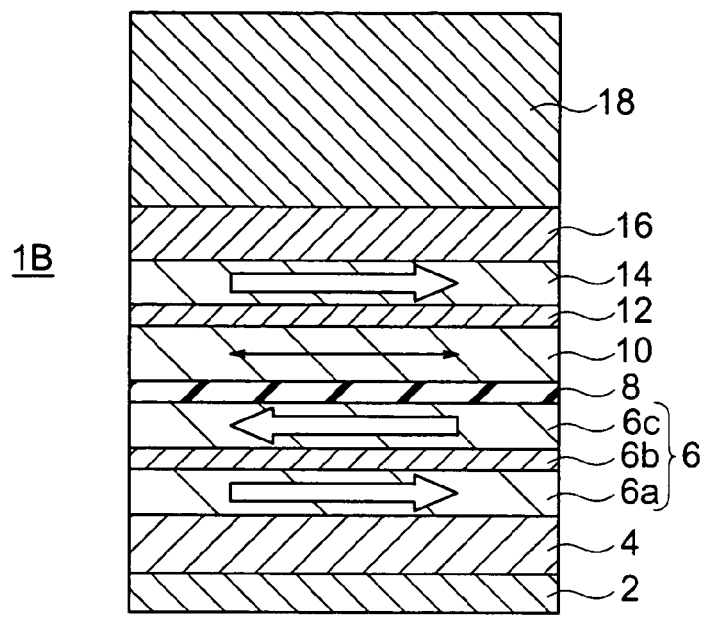
FIG. 3 is a sectional view showing the configuration of a magneto-resistive effect element according to a third embodiment of the present invention.

The configuration of a magneto-resistive effect element according to a third embodiment of the present invention is shown in FIG. 3. A magneto-resistive effect element 1B in this embodiment is obtained such that the magnetization-pinned layer 6 has a three-layer laminated structure constituted by a magnetic layer 6a, a nonmagnetic layer 6b, and a magnetic layer 6c in the magneto-resistive effect element 1 according to the first embodiment shown in FIG. 1. In this case, as shown in FIG. 3, the spin direction of the magnetic layer 6c close to the magnetic recording layer 10 is pinned to be a direction opposing the spin direction of the magnetization-pinned layer 14.

In the magneto-resistive effect element 1B according to the third embodiment, the spin direction of the magnetic layer 6c close to the magnetic recording layer 10 is pinned to be the direction opposing the spin direction of the magnetization-pinned layer 14. For this reason, the magneto-resistive effect element 1B has the same configuration as that of the magneto-resistive effect element 1 according to the first embodiment. As in the first embodiment, "1" and "0" can be written with low power consumption by spin injection, and a current for writing data can be made smaller than that of writing by spin injection in an ordinal tunnel junction element. For this reason, dielectric breakdown of the tunnel barrier layer can be prevented in writing, and a high-reliable magneto-resistive effect element can be obtained.

In the embodiment, as in the first embodiment, the nonmagnetic metal layer 12 can be replaced with a tunnel barrier layer.

In the embodiment, the magnetization-pinned layer 14 is constituted by a magnetic layer having a single-layer structure. However, as in the second embodiment, the magnetization-pinned layer 14 can have a three-layer structure constituted by a magnetic layer, a nonmagnetic layer, and a magnetic layer, or may have a multi-layer structure constituted by five or more layers and obtained by inserting nonmagnetic layers between the magnetic layers. Similarly, the magnetization-pinned layer 6 can have a multi-layer structure constituted by five or more layers and obtained by inserting nonmagnetic layers between magnetic layers.

(Fourth Embodiment)

Figure 4:
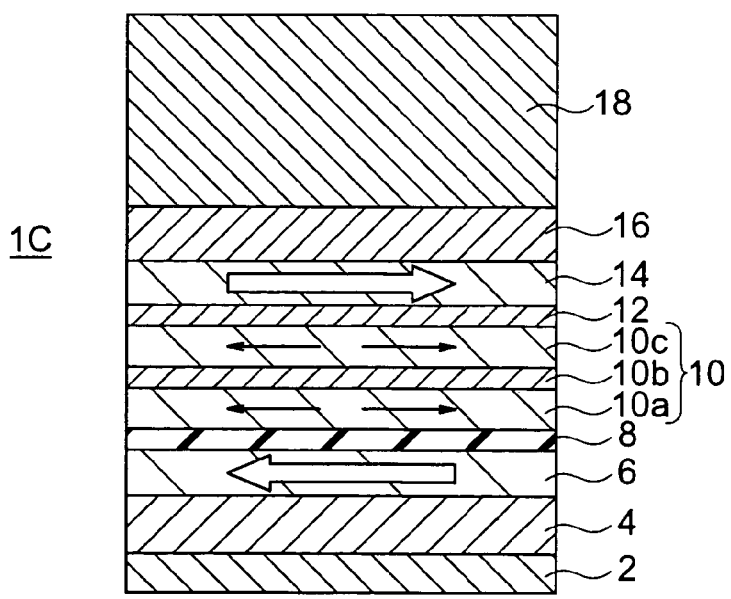
FIG. 4 is a sectional view showing the configuration of a magneto-resistive effect element according to a fourth embodiment of the present invention.

The configuration of a magneto-resistive effect element according to a fourth embodiment of the present invention is shown in FIG. 4. A magneto-resistive effect element 1C according to the embodiment is constituted such that the magnetic recording layer 10 has a three-layer laminated structure constituted by a magnetic layer 10a, a nonmagnetic layer 10b, and a magnetic layer 10c in the magneto-resistive effect element 1 according to the first embodiment. In this case, an interaction between the magnetic layers 10a and 10c arranged through the nonmagnetic layer 10b is designed to be ferromagnetic.

In general, the thickness of the magnetic recording layer must be larger than the element size to some extent to keep resistance to heat disturbances. However, when the film thickness is simply increased, a diamagnetic field becomes large. As a result, a current required for spin inversion disadvantageously increases.

However, when a laminated structure film obtained by interposing the nonmagnetic layer 10b between the magnetic layers 10a and 10c is used as the magnetic recording layer 10 having the configuration of the embodiment, spin injection with a small ferromagnetic interaction causes spins in the magnetic layer on the side on which spin-polarized electrons are injected to be previously inverted, and the ferromagnetic interactive assists inversion of the other magnetic layer (in contrast to this, the other magnetic layer assists spin inversion of the previously inverted magnetic layer (action/reaction)). For this reason, the inverted magnetic fields are mutually reduced, and spin current required for inversion can be reduced in comparison with the first embodiment. When writing by spin injection is not performed, the following merits are achieved. That is, resistance to heat disturbances becomes preferable due to ferromagnetic coupling, a gradation becomes better, and an effective MR ratio in reading increases.

The strength of the ferromagnetic interaction between the magnetic layers 10a and 10c arranged through the nonmagnetic layer 10b is preferably 2000 Oe or less.

In the embodiment, the magnetic recording layer 10 is obtained by interposing the nonmagnetic layer 10b between the two magnetic layers 10a and 10c. However, the magnetic recording layer 10 may be a multi-layer laminated structure film constituted by five or more layers including at least three magnetic layers and two nonmagnetic layers. In this case, interactions between the magnetic fields are designed to be ferromagnetic.

As described above, according to the embodiment, as in the first embodiment, "1" and "0" can be written with a lower power consumption by spin injection, and a current for writing data can be made smaller than that of writing by spin injection in an ordinal tunnel junction element. For this reason, dielectric breakdown of the tunnel barrier layer can be prevented in writing, and a high-reliable magneto-resistive effect element can be obtained.

According to the embodiment, a current required for spin inversion can be further reduced in comparison with the magneto-resistive effect element according to the first embodiment.

In the embodiment, as in the first embodiment, the nonmagnetic metal layer 12 can be replaced with a tunnel barrier layer.

(Fifth Embodiment)

Figure 5:
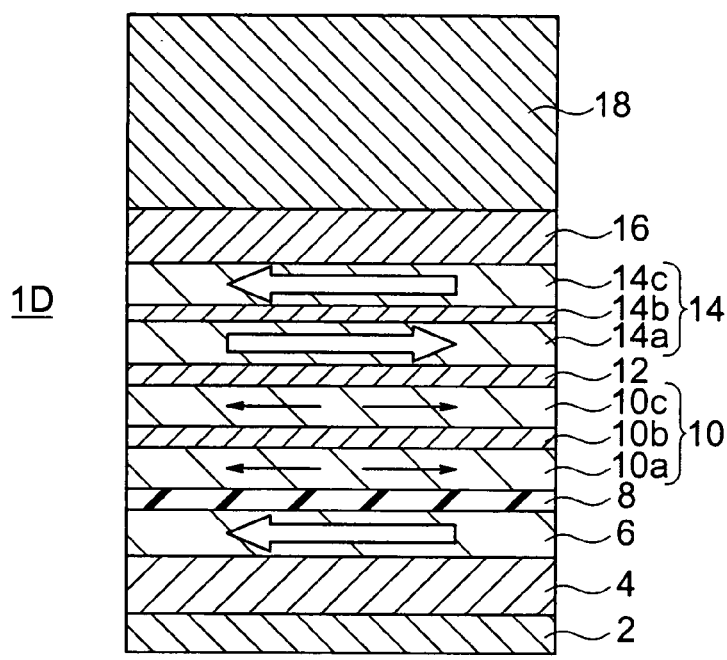
FIG. 5 is a sectional view showing the configuration of a magneto-resistive effect element according to a fifth embodiment of the present invention.

The configuration of a magneto-resistive effect element according to a fifth embodiment of the present invention is shown in FIG. 5. A magneto-resistive effect element 1D according to the embodiment is constituted such that the magnetic recording layer 10 has a three-layer laminated structure constituted by a magnetic layer 10a, a nonmagnetic layer 10b, and a magnetic layer 10c in the magneto-resistive effect element 1A according to the second embodiment shown in FIG. 2. In this case, an interaction between the magnetic layers 10a and 10c arranged through the nonmagnetic layer 10b is designed to be ferromagnetic, and, as shown in FIG. 5, the spin direction of the magnetic layer 14a close to the magnetic recording layer 10 is pinned to be a direction opposing the spin direction of the magnetization-pinned layer 6.

As described above, according to the embodiment, as in the second embodiment, "1" and "0" can be written with low power consumption by spin injection, and a current for writing data can be made smaller than that of writing by spin injection in an ordinal tunnel junction element. For this reason, dielectric breakdown of the tunnel barrier layer can be prevented in writing, and a high-reliable magneto-resistive effect element can be obtained.

According to the embodiment, a current required for spin inversion can be further reduced, as in the fourth embodiment, in comparison with the magneto-resistive effect element according to the second embodiment.

In the embodiment, as in the first embodiment, the nonmagnetic metal layer 12 may be replaced with a tunnel barrier layer.

(Sixth Embodiment)

Figure 6:
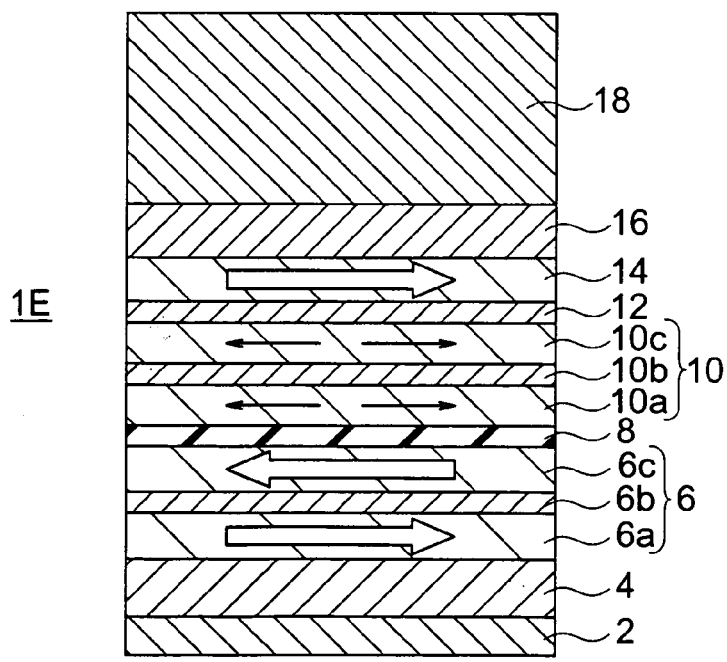
FIG. 6 is a sectional view showing the configuration of a magneto-resistive effect element according to a sixth embodiment of the present invention.

The configuration of a magneto-resistive effect element according to a sixth embodiment of the present invention is shown in FIG. 6. A magneto-resistive effect element 1E according to the embodiment is constituted such that the magnetic recording layer 10 has a three-layer laminated structure constituted by a magnetic layer 10a, a nonmagnetic layer 10b, and a magnetic layer 10c in the magneto-resistive effect element 1B according to the third embodiment shown in FIG. 3. In this case, an interaction between the magnetic layers 10a and 10c arranged through the nonmagnetic layer 10b is designed to be ferromagnetic, and, as shown in FIG. 6, the spin direction of the magnetic layer 6c close to the magnetic recording layer 10 is pinned to be a direction opposing the spin direction of the magnetization-pinned layer 14.

According to the embodiment, as in the fourth embodiment, a current required for spin inversion can be further reduced in comparison with the magneto-resistive effect element according to the third embodiment.

According to the embodiment, as in the third embodiment, "1" and "0" can be written with low power consumption by spin injection, and a current for writing data can be made smaller than that of writing by spin injection in an ordinal tunnel junction element. For this reason, dielectric breakdown of the tunnel barrier layer can be prevented in writing, and a high-reliable magneto-resistive effect element can be obtained.

In the sixth embodiment, as in the first embodiment, the nonmagnetic metal layer 12 can be replaced with a tunnel barrier layer.

In the sixth embodiment, the magnetization-pinned layer 14 is constituted by a magnetic layer having a single-layer structure. However, as in the fifth embodiment, the magnetization-pinned layer 14 can have a three-layer structure constituted by a magnetic layer, a nonmagnetic layer, and a magnetic layer, or can have a multi-layer structure constituted by five or more layers and obtained by inserting nonmagnetic layers between the magnetic layers. Similarly, the magnetization-pinned layer 6 can have a multi-layer structure constituted by five or more layers and obtained by inserting nonmagnetic layers between magnetic layers.

In the first to sixth embodiments,
the magnetic layer of the magneto-resistive effect element is constituted by a thin film of one material selected from a group consisting of an Ni—Fe alloy, a Co—Fe alloy, a Co—Fe—Ni alloy, or a (Co, Fe, Ni)—(Si, B) alloy, a (Co, Fe, Ni)—(Si, B)—(P, Al, Mo, Nb, Mn)-based alloy, or an amorphous material such as a Co—(Zr, Hf, Nb, Ta, Ti) film, and a Heusler material such as a Co—Cr—Fe—Al-based alloy or a multi-layer film consisting of these materials. Reference symbol "—" denotes a contained component, and "(,)" means that at least one element is selected from elements in the parentheses.

The magnetization-pinned layers 6 and 14 desirably have unidirectional anisotropy, and the magnetic recording layer 10 desirably has uniaxial anisotropy. The thicknesses of these layers desirably fall within the range of 0.1 nm to 100 nm. In addition, the thicknesses of the magnetic layers (ferromagnetic layers) included in the magnetization-pinned layers 6 and 14 and the magnetic recording layer 10 must be thicknesses at which super paramagnetism does not occur, i.e., are desirably set at 0.4 nm or more.

Further, it is preferable that magnetization of a ferromagnetic layer used as the magnetization-pinned layer is fixed by providing an anti-ferromagnetic film to the magnetization-pinned layer. Such an anti-ferromagnetic film can comprise Fe (iron)—Mn (manganese), Pt (platinum—Mn (manganese), Pt (platinum)—Cr (chromium)—Mn (manganese), Ni (nickel)—Mn (manganese), Ir (iridium)—Mn (manganese), NiO (nickel oxide), $Fe_2O_3$ (iron oxide) or the like.

Furthermore, the magnetic characteristic of magnetic material used may be adjusted by adding thereto nonmagnetic element such as Ag (silver), Cu (copper), Au (gold), Al (aluminum), Mg (magnesium), Si (silicone), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium) or the like. Besides, various physical properties such as crystallization, mechanical properties, chemical properties or the like can be adjusted.

More specifically, as a method of pinning a magnetic layer in one direction, a laminated film having a three-layer structure consisting of Co (Co—Fe)/Ru (ruthenium)/Co (Co—Fe), a laminated film having a three-layer structure consisting of Co (Co—Fe)/Ir (iridium)/Co (Co—Fe), a laminated film having a three-layer structure consisting of Co (Co—Fe)/Os (osmium)/Co (Co—Fe), a laminated film having a three-layer structure consisting of Co (Co—Fe)/Re (rhenium)/Co (Co—Fe), a laminated film having a three-layer structure consisting of a Co—Fe—B amorphous material layer, Ru (ruthenium) layer, a Co—Fe—B amorphous material layer, a laminated film having a three-layer structure constituted by an amorphous material layer such as a Co—Fe—B layer, Ir (iridium) layer, an amorphous material layer such as a Co—Fe—B layer, a laminated film having a three-layer structure constituted by an amorphous material layer such as a Co—Fe—B layer, Os (osmium) layer, an amorphous material layer such as a Co—Fe—B layer, and a laminated film having a three-layer structure constituted by an amorphous material layer such as a Co—Fe—B layer, Re (rhenium) layer, and amorphous material layer such as a Co—Fe—B layer are used. When these laminated films are used as magnetization-pinned layers, anti-ferromagnetic films are desirably further formed adjacent to the magnetization-pinned layers. As the anti-ferromagnetic film used in this case, as in the above description, Fe—Mn, Pt—Mn, Pt—Cr—Mn, Ni—Mn, Ir—Mn, NiO, $Fe_2O_3$, and the like can be used. When this structure is used, the magnetization of the magnetization-pinned layer are not easily affected by a magnetic field induced by current from a bit line or a word line, and the magnetization is pinned. A stray field from the magnetization-pinned layer can be reduced (or controlled), and the thicknesses of the two ferromagnetic layers constituting the magnetization-pinned layer are changed to make it possible to control a magnetization shift of the magnetic recording layer.

As the magnetic recording layer, a two-layer structure constituted by a soft magnetic material layer and a ferromagnetic layer or a three-layer structure constituted by a ferromagnetic layer, a soft magnetic layer, and a ferromagnetic layer may be used. A three-layer structure constituted by a ferromagnetic layer, a nonmagnetic layer, and a ferromagnetic layer and a five-layer structure constituted by a ferromagnetic layer, a nonmagnetic layer, a ferromagnetic layer, a nonmagnetic layer, and a ferromagnetic layer are used as magnetic recording layers to control the strength of interaction between the ferromagnetic layers. For this reason, even though the cell width of the magnetic recording layer serving as a memory cell is submicron, a more preferable effect that needs not increase a power consumption of a magnetic field induced by current can be obtained. At this time, the types and the thicknesses of the ferromagnetic layers may be changed.

In particular, when Co—Fe, Co—Fe—Ni, Fe-rich Ni—Fe which increase MR ratio is used as the material of a ferromagnetic layer close to an insulating barrier, and when Ni-rich Ni—Fe, Ni-rich Ni—Fe—Co, or the like is used as a ferromagnetic material which is not in contact with an insulating film, a switching magnetic field can be preferably reduced while keeping MR ratio large.

As the nonmagnetic material, Ag (silver), Cu (copper), Au (gold), Al (aluminum), Ru (ruthenium), Os (osmium), Re (rhenium), Si (silicon), Bi (bismuth), Ta (tantalum), B (boron), C (carbon), Pd (palladium), Pt (platinum), Zr (zirconium), Ir (iridium), W (tungsten), Mo (molybdenum), Nb (niobium), or an alloy thereof can be used.

In also the magnetic recording layer, a nonmagnetic element such as Ag (silver), Cu (copper), Au (gold), Al (aluminum), Ru (ruthenium), Os (osmium), Re (rhenium), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium) is added to these magnetic materials to control magnetic characteristics or to make it possible to control various physicallities such as crystallinity, mechanical characteristics, and chemical characteristics.

On the other hand, when a TMR element is used as a magneto-resistive effect element, as a tunnel barrier layer (or dielectric layer) arranged between a magnetization-pinned layer and a magnetic recording layer, various insulators (dielectric materials) such as $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (strontium titanium dioxide), $AlLaO_3$ (aluminum lanthanum trioxide), Al—N—O (aluminum oxynitride), or the like can be used.

These compounds need not have a perfectly precise stoichiometric composition. Oxygen, nitrogen, fluorine, or the like may be lacked, or may be over or short. In addition, it is desired that the thickness of the insulating layer (dielectric layer) is so small that a tunnel current flows in the insulating layer. Actually, the thickness is desirably 10 nm or less.

The magneto-resistive effect element can be formed on a predetermined substrate by using a conventional thin-film forming means such as various sputtering methods, a deposition method, or molecular beam epitaxy. As a substrate used in this case, for example, various substrates such as Si (silicon), $SiO_2$ (silicon oxide), $Al_2O_3$ (aluminum oxide), spinel, and AlN (aluminum nitride) substrates can be used.

On the substrate, as an underlying layer, a protective layer, a hard mask, or the like, a layer consisting of Ta (tantalum), Ti (titanium), Pt (platinum) Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum)—Cu (copper), Ru (ruthenium), Ir (iridium), Os (osmium), or the like may be formed. A symbol "/" denotes a laminated structure.

(Seventh Embodiment)

Figure 7:
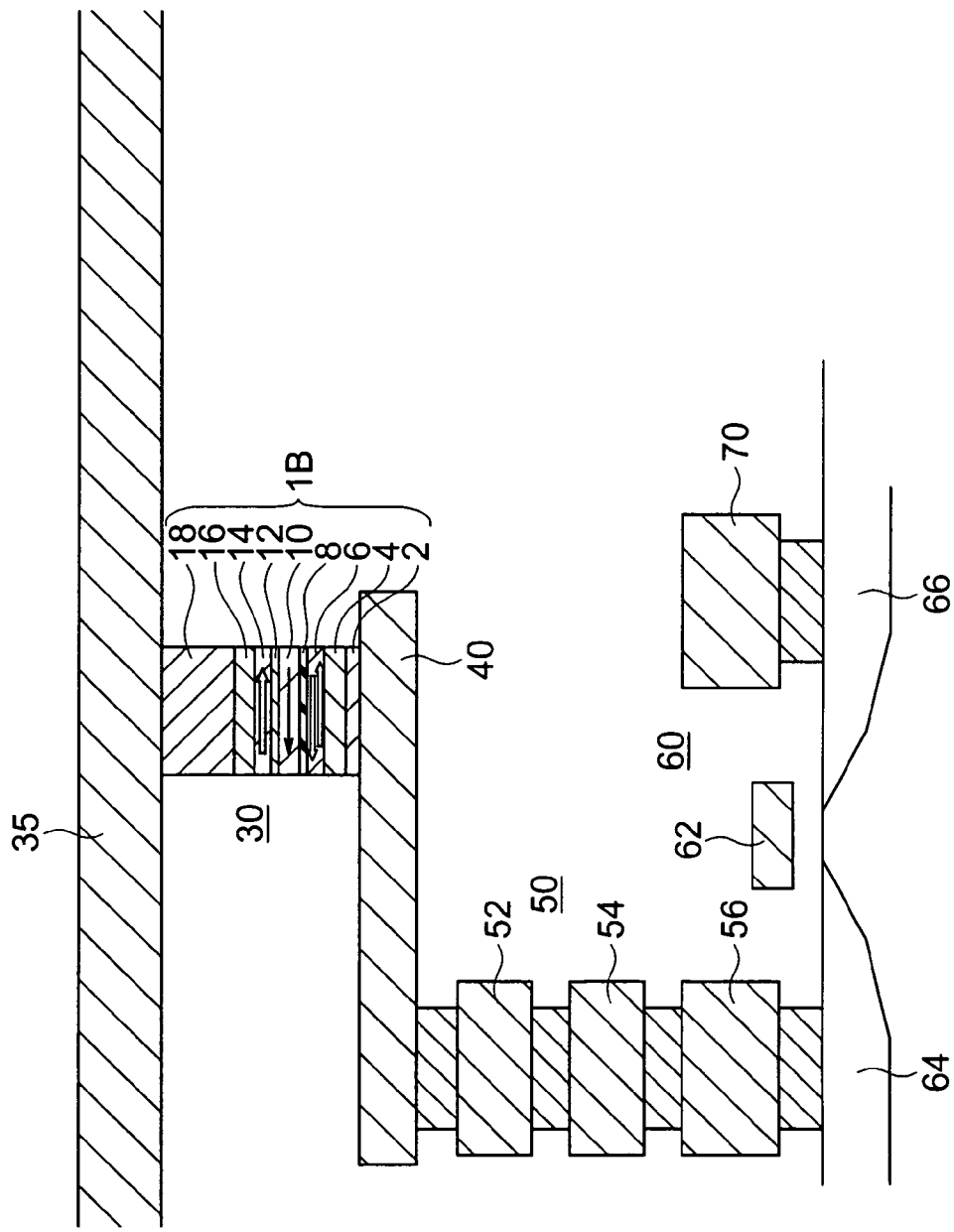
FIG. 7 is a sectional view showing the configuration of a magneto-resistive effect element according to a seventh embodiment of the present invention.

A magnetic memory according to a seventh embodiment of the present invention will be described below with reference to FIGS. 7 to 11(b). FIG. 7 is a sectional view showing the configuration of a memory cell of the magnetic memory according to the embodiment. The magnetic memory according to the embodiment comprises a plurality of memory cells 30 arranged in an array. Each memory cell 30 comprises a magneto-resistive effect element 1B according to the third embodiment shown in FIG. 3, a bit line 35, a leading electrode (leading wiring) 40, a connection section 50, and a selective transistor 60. The metal hard mask 18 of the magneto-resistive effect element 1B is connected to the bit line 35, and the underlying layer 2 is connected to the leading line 40. The connection section 50 comprises connection plugs 52, 54, and 56. The selective transistor 60 comprises a gate 62, a drain 64, and a source 66. One end of the connection section 50 connected to the leading electrode 40, and the other end is connected to the drain 64 of the selective transistor 60. The source 66 of the selective transistor 60 is connected to a cell selection line 70. The gate 62 of the selective transistor 60 may be connected to, e.g., a word line (not shown), and may be designed to select a memory cell together with the cell selection line 70. Although the cell selection line 70 has an arrangement different from that shown in FIG. 7, the cell selection line 70 may be arranged in parallel to the bit line 35 to be connected to a driver, a sinker, or the like for reading data.

An operation of the magnetic memory according to the embodiment will be described below with reference to FIGS. 8 to 11(b).

Figure 8:
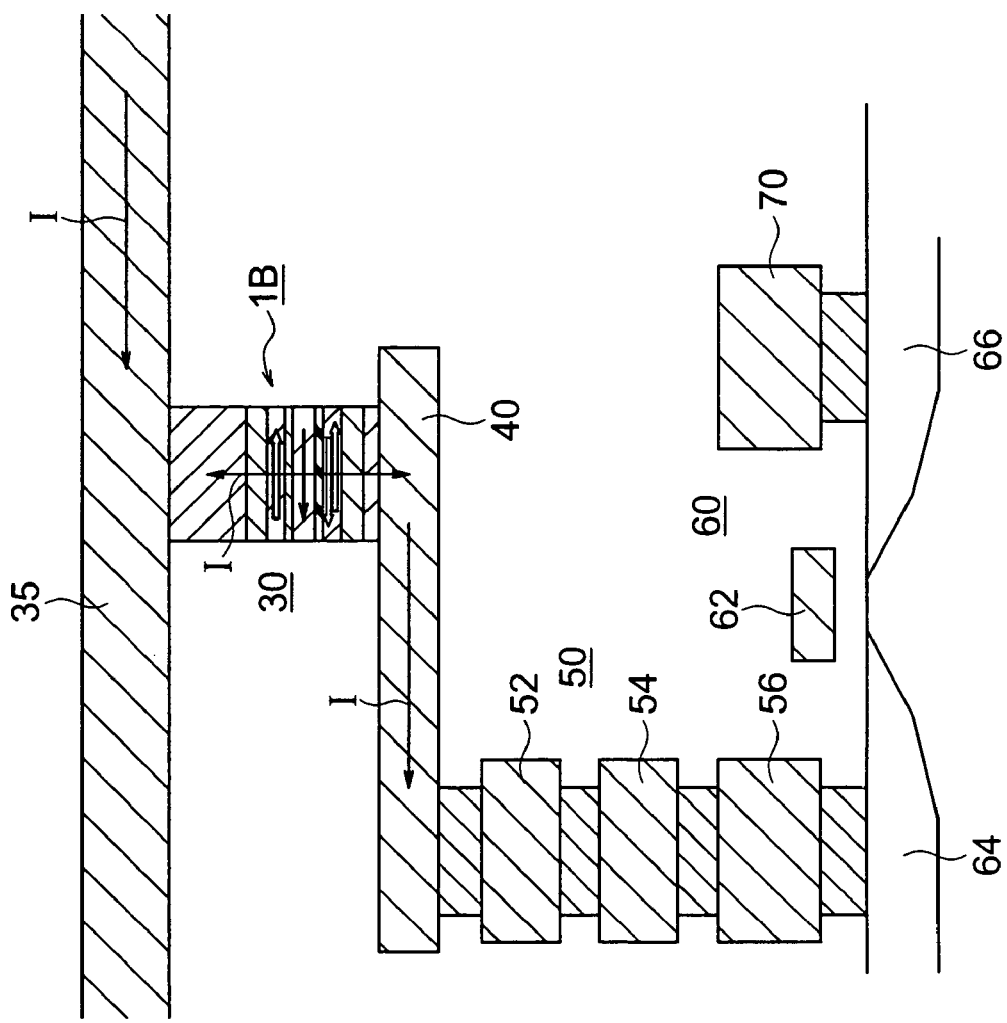
FIG. 8 is a sectional view of a memory cell for explaining a "0" writing operation of the magnetic memory according to the seventh embodiment of the present invention.
Figure 9:
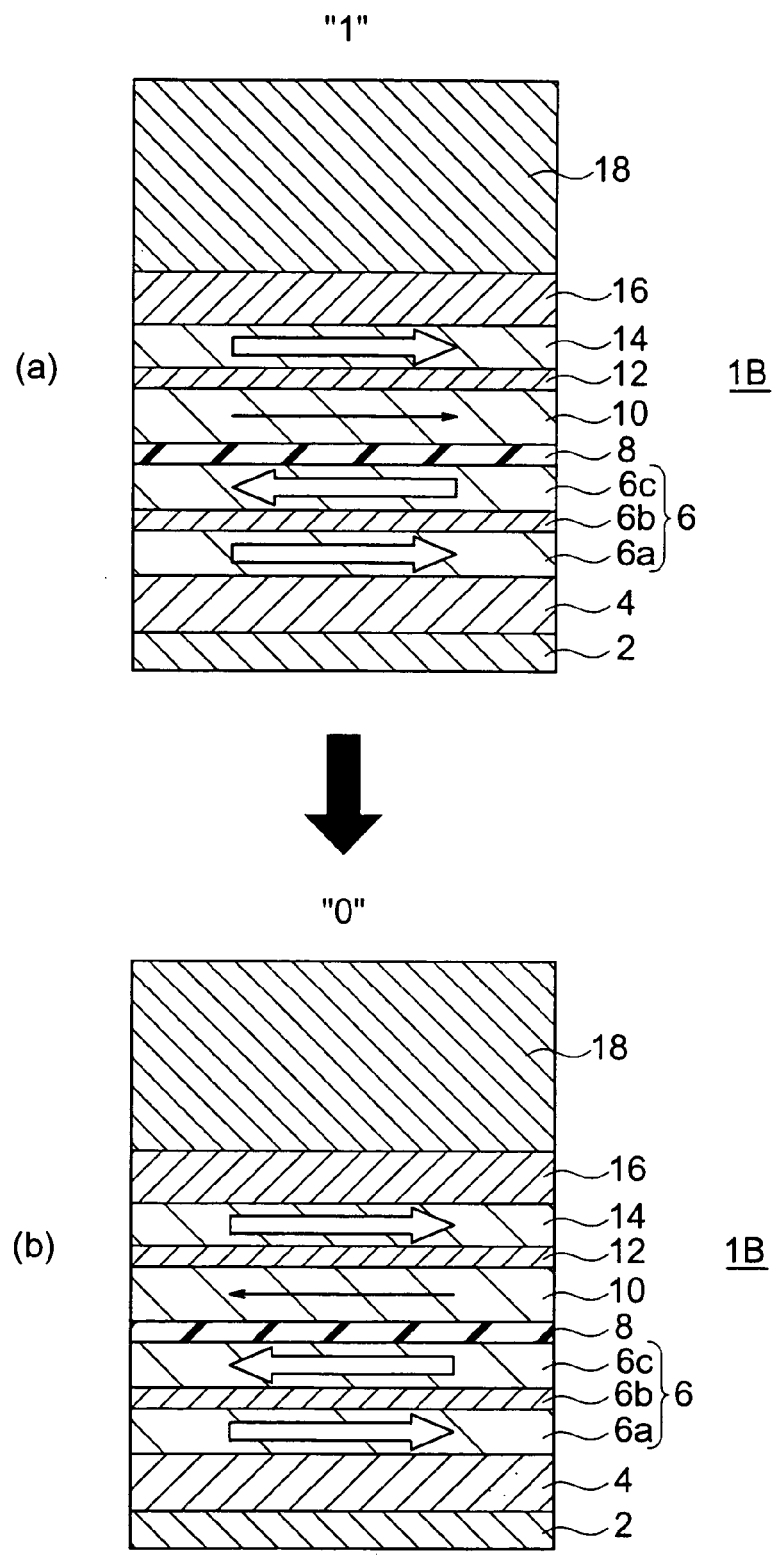
FIGS. 9(a) and 9(b) are sectional views showing directions of spins of the magneto-resistive effect element when "1" is updated with "0" in the magnetic memory according to the seventh embodiment.

A case in which "0" is written will be described first. FIG. 8 is a sectional view of a memory cell indicating the direction of a current obtained when "0" is written in the magnetic memory according to the embodiment. FIGS. 9(a) and 9(b) are sectional views showing directions of spins in the magneto-resistive effect element 1B when data "1" is updated with data "0". In the embodiment, the fact that the data "1" is recorded in the magneto-resistive effect element 1B means the fact that the direction of the spin of the magnetic recording layer 10 is anti-parallel to the direction of the spin of the magnetic layer 6c of the magnetization-pinned layer 6 as shown in FIG. 9(a). The fact that the data "0" is recorded in the magneto-resistive effect element 1B means the fact that the direction of the spin of the magnetic recording layer 10 is parallel to the direction of the spin of the magnetic layer 6c of the magnetization-pinned layer 6 as shown in FIG. 9(b).

When the data "0" is written when the data "1" is recorded in the magneto-resistive effect element 1B, as shown in FIG. 8, a predetermined voltage is applied to the gate of the selective transistor 60 to turn on the selective transistor 60, thereby sequentially flowing a current to the bit line 35, the magneto-resistive effect element 1B, the leading electrode 40, the connection unit 50, the drain 64, the source 66, and the cell selection line 70. In this case, since the direction of the current opposes the flowing direction of electrons, the electrons flow from the magnetization-pinned layer 6 into the magnetic recording layer 10 through the tunnel barrier layer 8. For this reason, electrons spin-polarized by the magnetic layer 6c of the magnetization-pinned layer 6 tunnel through the tunnel barrier layer 8 to cause spin torque to operate on the magnetic recording layer 10. At this time, since the spin-polarized electrons flow from the magnetic recording layer 10 into the magnetization-pinned layer 14 through the nonmagnetic metal layer 12, the spin moments of the magnetization-pinned layer 14 and the magnetic recording layer 10 are parallel while the spin of the magnetic recording layer 10 is anti-parallel to the spin of the magnetic layer 6c. For this reason, the reflected spin electrons reflected by the magnetization-pinned layer 14 also cause spin torque to operate on the magnetic recording layer 10, the spin of the magnetic recording layer 10 is inverted from anti-parallel to parallel with respect to the spin of the magnetic layer 6c (see FIGS. 9(a) and 9(b)).

Figure 10:
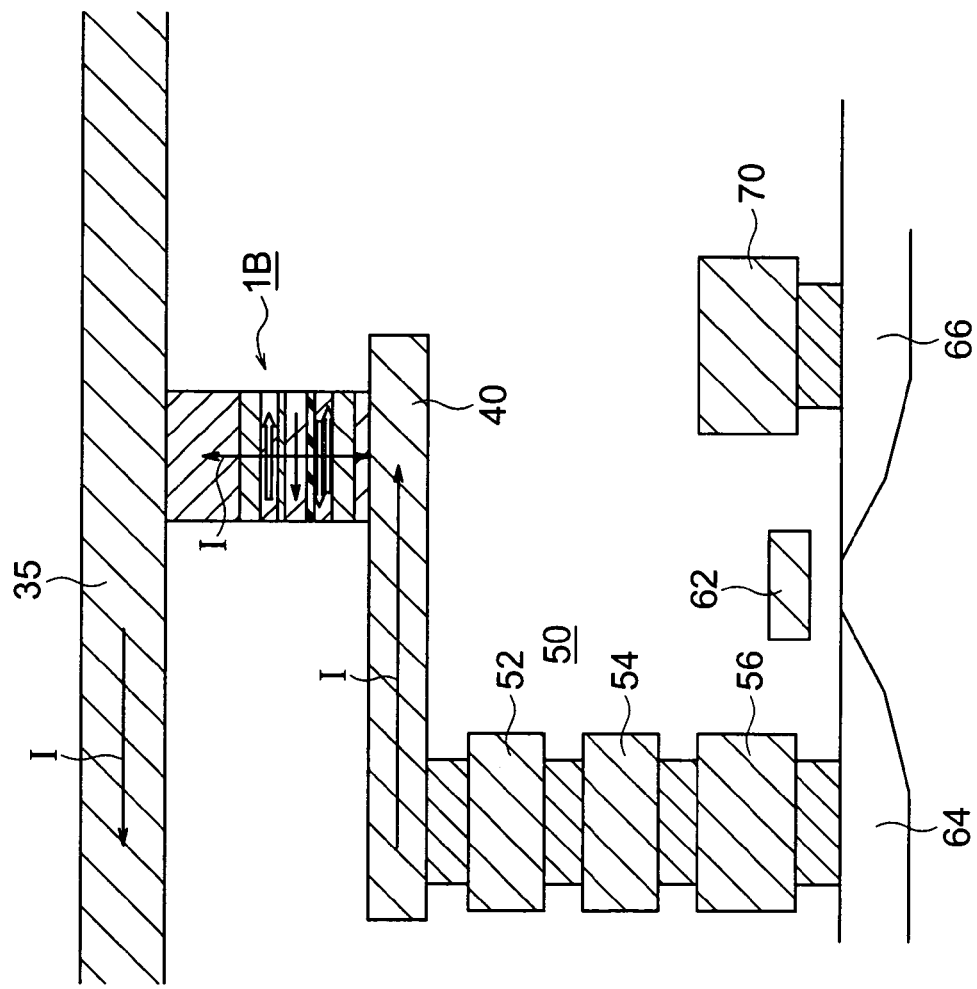
FIG. 10 is a sectional view of a memory cell for explaining a "1" writing operation of the magnetic memory according to the seventh embodiment of the present invention.
Figure 11:
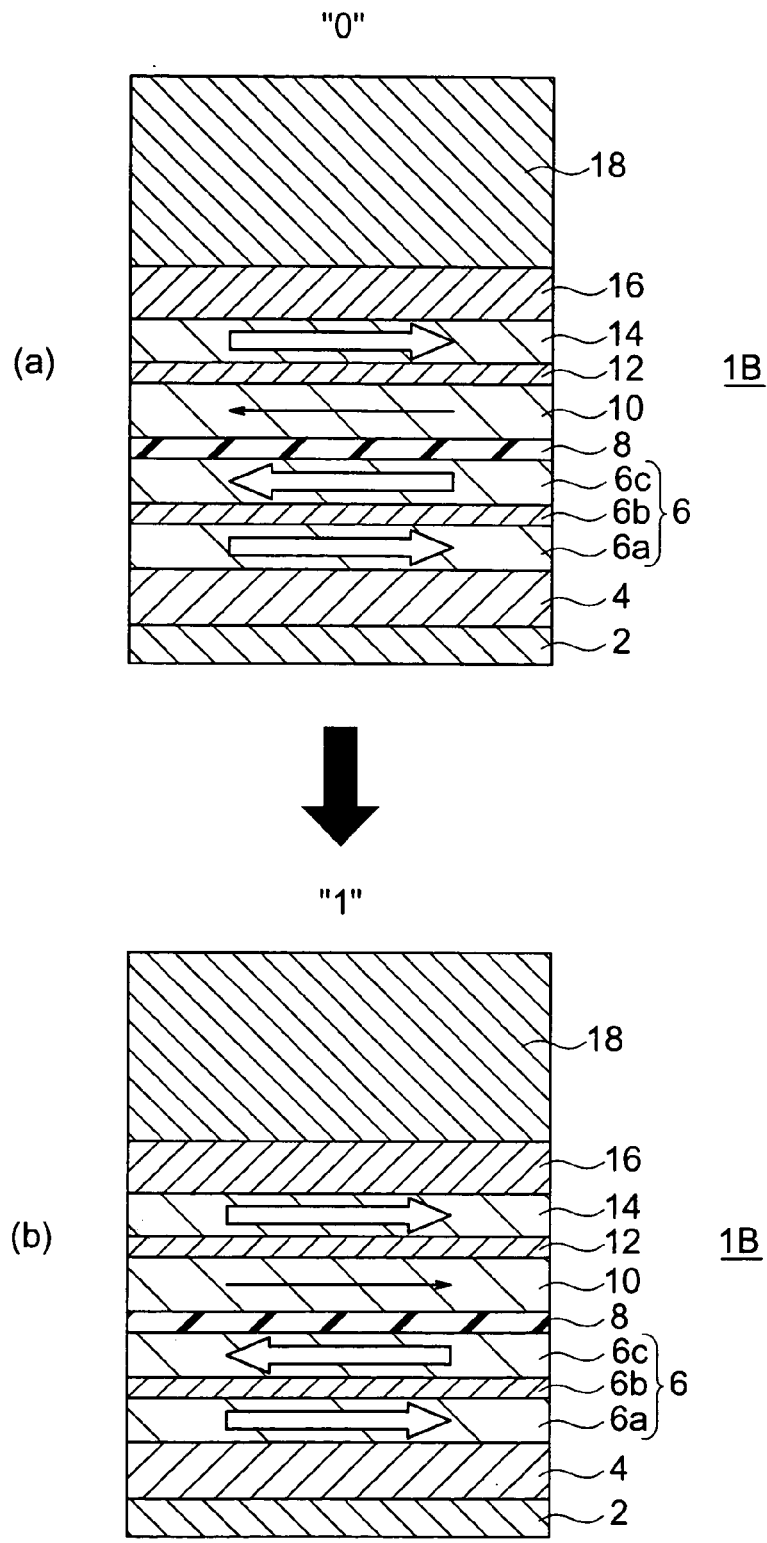
FIGS. 11(a) and 11(b) are sectional views showing directions of spins of the magneto-resistive effect element when "0" is updated with "1" in the magnetic memory according to the seventh embodiment.

A case in which "1" is written will be described below. FIG. 10 is a sectional view of a memory cell showing the direction of a current obtained when "1" is written in the magnetic memory according to the embodiment, FIGS. 11A and 11B are sectional views showing the directions of the magneto-resistive effect element 1B when data "0" is updated with data "1".

When the data "1" is written when the data "0" is recorded in the magneto-resistive effect element 1B, as shown in FIG.

10, a predetermined voltage is applied to the gate of the selective transistor 60 to turn on the selective transistor 60, thereby sequentially flowing a current to the cell selection line 70, the source 66, the drain 64, the connection unit 50, the leading electrode 40, the magneto-resistive effect element 1B, and the bit line 35. In this case, since the direction of the current opposes the flowing direction of electrons, the electrons flow from the magnetization-pinned layer 14 into the magnetic recording layer 10. For this reason, electrons spin-polarized by the magnetization-pinned layer 14 flow into the magnetic recording layer 10 through the nonmagnetic metal layer 12 to cause spin torque to operate on the magnetic recording layer 10. At this time, since the spin-polarized electrons tend to tunnel through the tunnel barrier layer 8 and to flow into the magnetic layer 6c of the magnetization-pinned layer 6. However, when the electrons tunnel through the tunnel barrier layer 8, electrons having the same spin direction as the spin direction of the magnetic layer 6c easily tunnel through the tunnel barrier layer 8 with high probability, but electrons having an anti-parallel spin are reflected. The electrons reflected to the magnetic recording layer 10 cause spin torque to operate on the magnetic recording layer 10. With the two spin torques, the spin of the magnetic recording layer 10 is inverted from parallel to anti-parallel with respect to the spin of the magnetic layer 6c (see FIGS. 11A and 11B).

As described above, according to the embodiment, spin injection makes it possible to write "1" and "0" with low power consumption, and a current for writing data can be made smaller than that of writing by spin injection in a conventional tunnel junction element. For this reason, dielectric breakdown of the tunnel barrier layer can be prevented in writing, and a high-reliable magnetic memory can be obtained.

In the embodiment, a voltage is applied across the bit line 35 and the cell selection line 70, and a current flowing in the magneto-resistive effect element 1B is detected to make it possible to perform reading. Therefore, it is apparent that the current for writing data is set to be larger than the current for reading data.

In the embodiment, in the magneto-resistive effect element 1B, the underlying layer 2 is arranged on the leading electrode 40 side, and the metal hard mask 18 is arranged on the bit line 35 side. However, the metal hard mask 18 may be arranged on the leading electrode 40 side, and the underlying layer 2 may be arranged on the bit line 35 side.

In the embodiment, the magneto-resistive effect element according to the third embodiment is used as a magneto-resistive effect element for a memory cell. The magneto-resistive effect element according to any one of the first, second, fourth, to sixth embodiments may be used.

(Eighth Embodiment)

Figure 12:
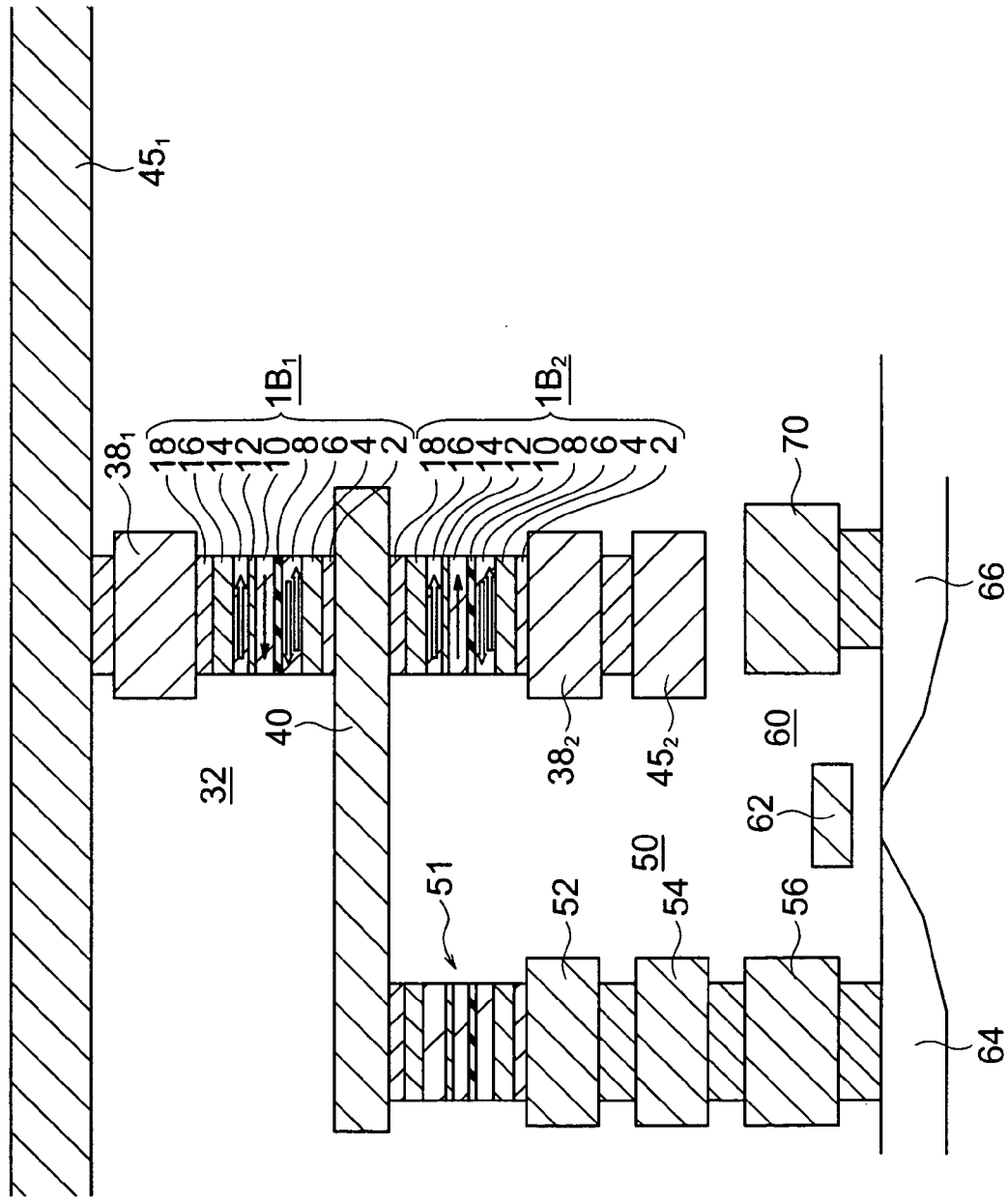
FIG. 12 is a sectional view showing the configuration of a memory cell of a magnetic memory according to an eighth embodiment of the present invention.

A magnetic memory according to an eighth embodiment of the present invention will be described below with reference to FIGS. 12 to 19. FIG. 12 is a sectional view showing the configuration of a memory cell of the magnetic memory according to the embodiment. The magnetic memory according to the embodiment comprises a plurality of memory cells 32 arranged in an array. Each memory cell 32 comprises magneto-resistive effect elements $1B_1$ and $1B_2$ according to the third embodiment shown in FIG. 3, a leading electrode (leading wiring) 40, bit lines $45_1$ and $45_2$, a connection unit 50, and a selective transistor 60.

A metal hard mask 18 of the magneto-resistive effect element $1B_1$ is connected to the bit line $45_1$ through a connection plug $38_1$, and an underlying layer 2 is connected to the leading electrode 40. A metal hard mask 18 of the magneto-resistive effect element $1B_2$ is connected to the leading electrode 40, and an underlying layer 2 is connected to the bit line $45_2$ through a connection plug $38_2$. More specifically, the layer arrangement of the magneto-resistive effect element $1B_1$ in a direction leading from the leading electrode 40 to the bit line $45_1$ opposes the layer arrangement of the magneto-resistive effect element $1B_2$ leading from the leading electrode 40 to the bit line $45_2$.

The connection section 50 comprises connection plugs 51, 52, 54, and 56. Since the connection plug 51 is formed on the same layer as the layer on which the magneto-resistive effect element $1B_2$, the connection plug 51 has the same layer configuration as that of the magneto-resistive effect element $1B_2$. The selective transistor 60 comprises a gate 62, the drain 64, and the source 66. One end of the connection section 50 is connected to the leading electrode 40, and the other end is connected to the drain 64 of the selective transistor 60. The source 66 of the selective transistor 60 is connected to a cell selection line 70. The gate 62 of the selective transistor 60 may be connected to, e.g., a word line (not shown), and may be designed to select a memory cell together with the cell selection line 70.

In the magnetic memory according to the embodiment arranged as described above, as shown in FIG. 12, the spin directions of the magnetic recording layers 10 of the magneto-resistive effect elements $1B_1$ and $1B_2$ are designed to be different from each other by about 180° in each memory cell 32. More specifically, different data are recorded on the magnetic recording layers 10 of the magneto-resistive effect elements $1B_1$ and $1B_2$, respectively.

Figure 13:
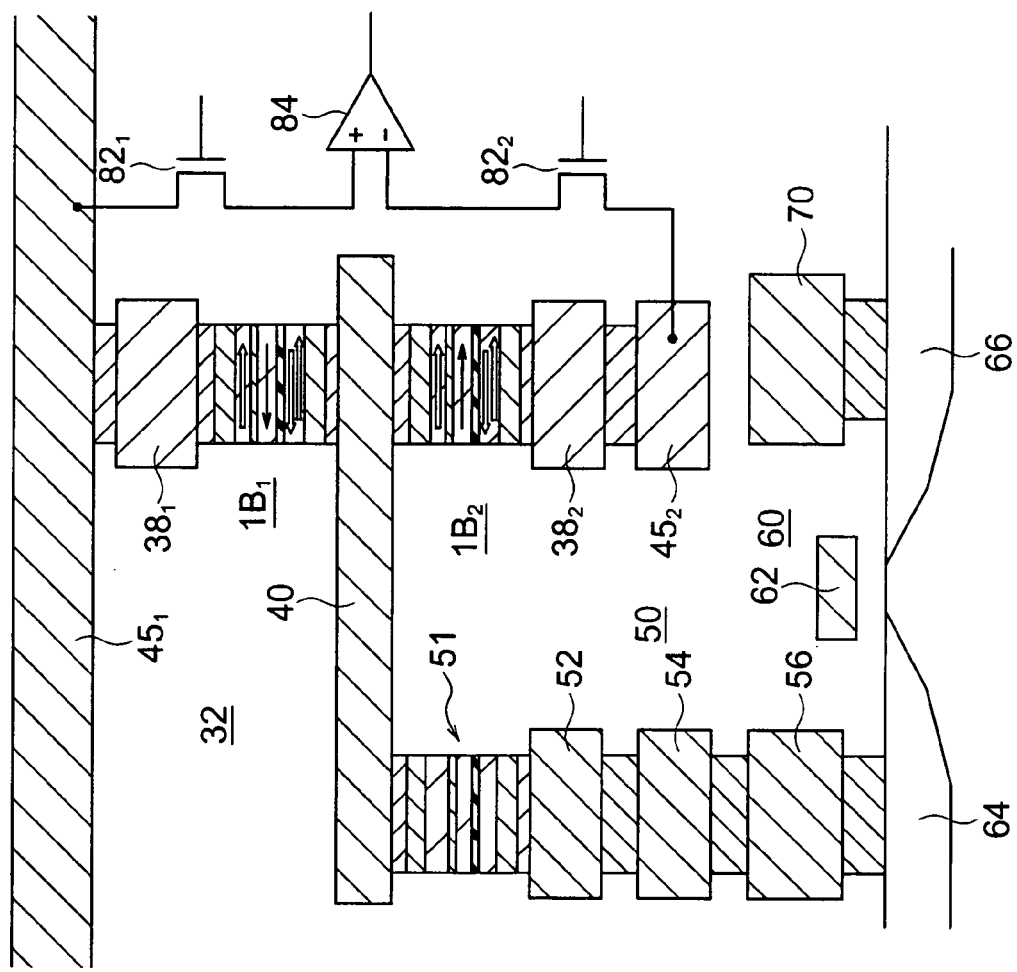
FIG. 13 is a sectional view of a memory cell for explaining a reading operation of a magnetic memory according to the eighth embodiment of the present invention.

An operation of the magnetic memory according to the embodiment will be described below. A reading operation of the magnetic memory according to the embodiment will be described first with reference to FIG. 13. FIG. 13 is a sectional view for explaining the reading operation of the magnetic memory according to the embodiment. When data recorded on the magnetic memory is read, the selective transistor 60 is turned on to flow a current from the cell selection line 70 into the selective transistor 60, the connection unit 50, and the leading electrode 40. At this time, the current flowing into the leading electrode 40 is branched to the magneto-resistive effect elements $1B_1$ and $1B_2$. The branched currents flow into the bit lines $45_1$ and $45_2$, respectively. At this time, the currents flowing in the bit lines $45_1$ and $45_2$ are read by a differential amplifier 84 through transistors $82_1$ and $82_2$ to make it possible to read data at a high speed.

In the embodiment, the fact that data "0" is recorded on a memory cell 32, as shown in FIG. 14, means the fact that the spin direction of the magnetic recording layer 10 of the magneto-resistive effect element $1B_1$ is parallel to the spin direction of the magnetic layer of the magnetization-pinned layer 6 on the magnetic recording layer 10 side. The fact that data "1" is recorded, as shown in FIG. 15, means that the spin direction of the magnetic recording layer 10 of the magneto-resistive effect element $1B_1$ is anti-parallel to the spin direction of the magnetic layer of the magnetization-pinned layer 6 on the magnetic recording layer 10 side.

Figure 16:
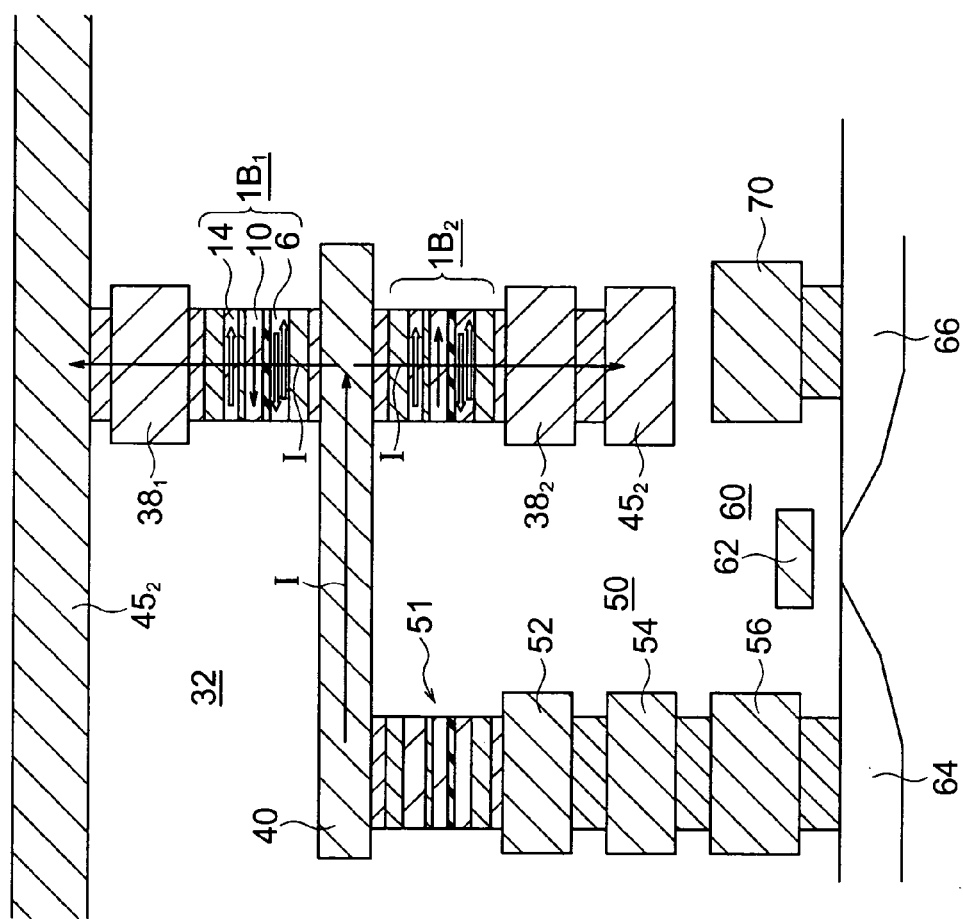
FIG. 16 is a sectional view of the memory cell for explaining a "1" writing operation of the magnetic memory according to the eighth embodiment of the present invention.
Figure 17:
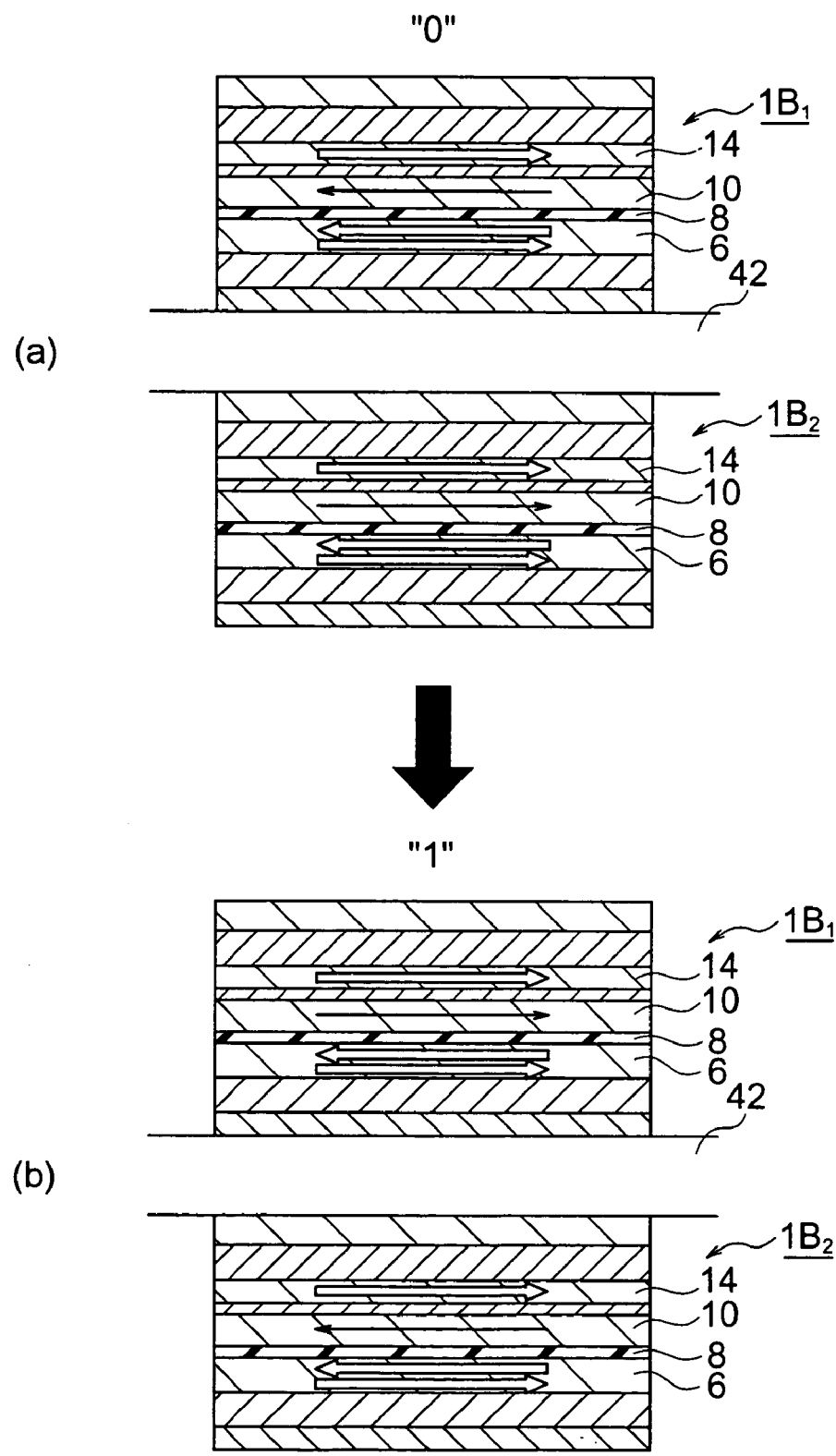
FIGS. 17(a) and 17(b) are sectional views showing directions of spins of the magneto-resistive effect element when "0" is updated with "1" in the magnetic memory according to the eighth embodiment.

A case in which "1" is written in a memory cell of the magnetic memory according to the embodiment will be described below with reference to FIGS. 16 and 17(b). FIG. 16 is a sectional view of a memory cell showing the direction of a current obtained when "1" is written in the magnetic memory according to the embodiment, and FIGS. 17(a) and 17(b) are sectional views showing the spin directions of the magneto-resistive effect elements $1B_1$ and $1B_2$ when the data "0" is updated with the data "1". When "1" is written, the selective transistor 60 is turned on to flow a current for writing data from the cell selection line 70 to the leading electrode 40 through the selective transistor 60 and the connection section 50. At this time, the current flowing into the leading electrode 40 is branched to the magneto-resistive effect elements 1B$_1$ and 1B$_2$, and the currents flow into the bit lines 45$_1$ and 45$_2$, respectively. When a current from the leading electrode 40 to the bit line 45$_1$, a spin is injected from the magnetization-pinned layer 14 of the magneto-resistive effect element 1B$_1$ into the magnetic recording layer 10, as in the third embodiment, the spin of the magnetic recording layer 10 is inverted. When a current flows from the leading electrode 40 to the bit line 45$_2$, a spin is injected from the magnetic layer of the magnetization-pinned layer 6 on the magnetic recording layer 10 side in the magneto-resistive effect element 1B$_2$. As in the third embodiment, the spin of the magnetic recording layer 10 is inverted. In this manner, as shown in FIGS. 17(*a*) and 17(*b*), the data "0" is updated with the data "1".

Figure 18:
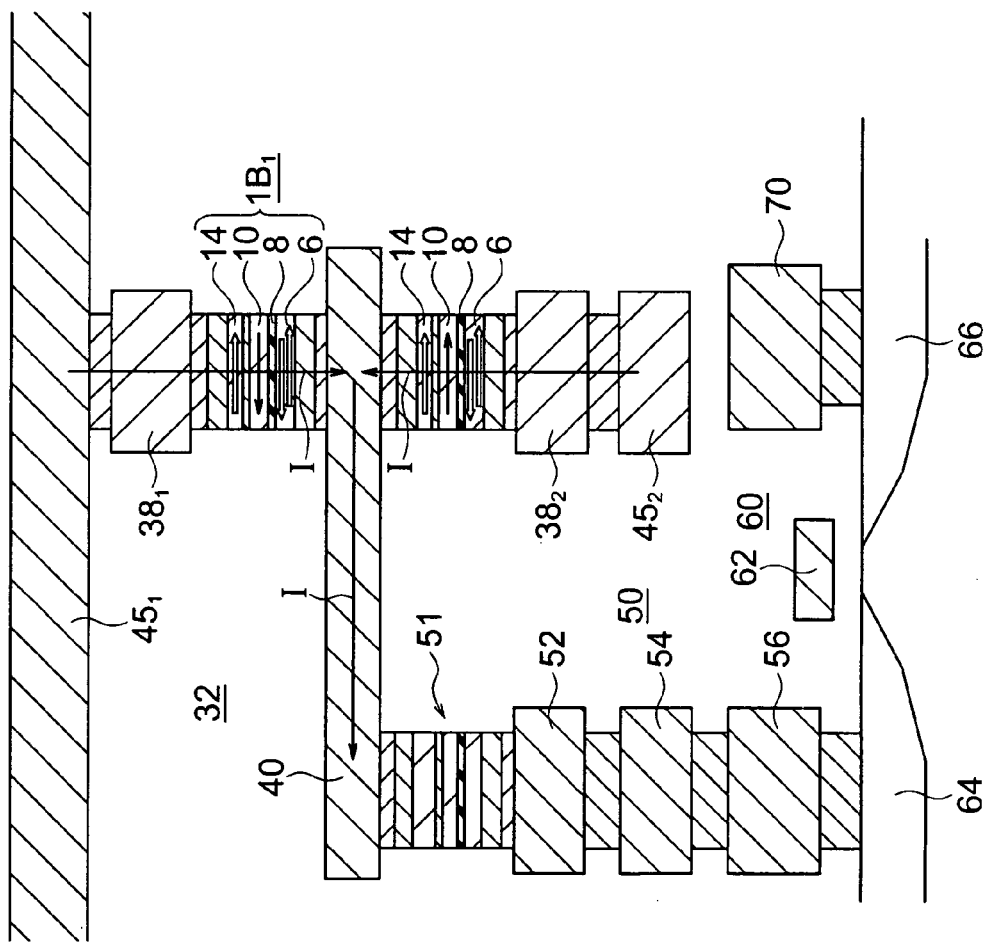
FIG. 18 is a sectional view of the memory cell for explaining a "0" writing operation of the magnetic memory according to the eighth embodiment of the present invention.
Figure 19:
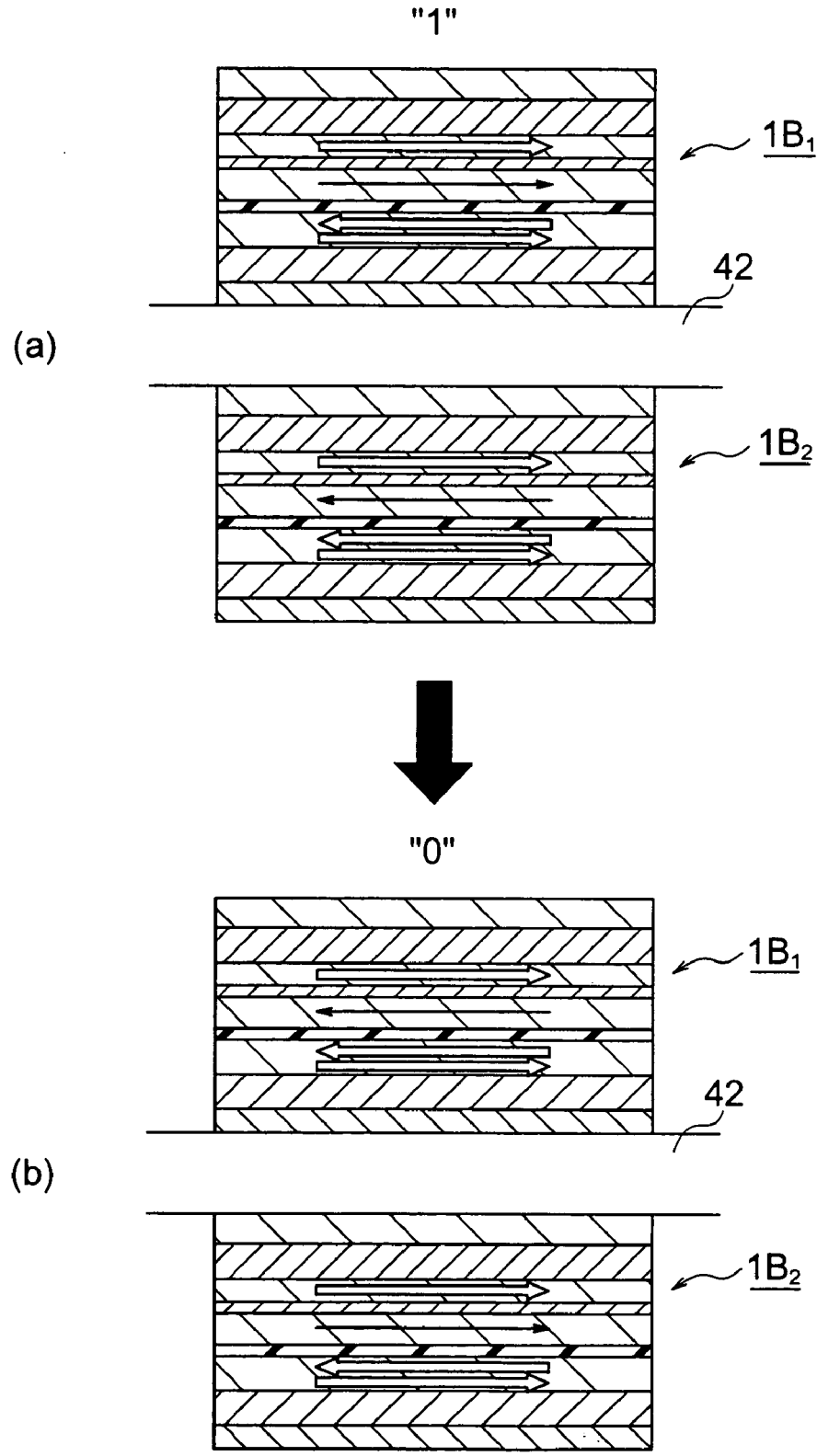
FIGS. 19(a) and 19(b) are sectional views showing directions of spins of the magneto-resistive effect element when "1" is updated with "0" in the magnetic memory according to the eighth embodiment.

A case in which "0" is written in a memory cell of the magnetic memory according to the embodiment will be described below with reference to FIGS. 18 to 19(*b*). FIG. 18 is a sectional view of a memory cell showing the direction of a current obtained when "0" is written in the magnetic memory according to the embodiment. FIGS. 19(*a*) and 19(*b*) are sectional views showing the directions of the spins of the magneto-resistive effect elements 1B$_1$ and 1B$_2$ when the data "1" is updated with the data "0". When "0" is written, the selective transistor 60 is firstly turned on to flow currents from the bit lines 45$_1$ and 45$_2$ to the leading electrode 40 through the magneto-resistive effect elements 1B$_1$ and 1B$_2$, respectively. These currents flow together in the leading electrode 40. The resultant current flows into the cell selection line 70 through the connection unit 50 and the selective transistor 60. When the currents flow from the bit lines 45$_1$ and 45$_2$ to the leading electrode 40 through the magneto-resistive effect elements 1B$_1$ and 1B$_2$, respectively, the spins of the magnetic recording layer 10 of the magneto-resistive effect elements 1B$_1$ and 1B$_2$ are inverted to write the data "0" (see FIGS. 19(*a*) and 19(*b*)).

As described above, according to the embodiment, spin injection makes it possible to write "1" and "0" with low power consumption, and a current for writing data can be made smaller than that of spin injection writing in a conventional tunnel junction device. For this reason, dielectric breakdown of the tunnel barrier layer can be prevented in writing, and a high-reliable magnetic memory can be obtained.

In the embodiment, it is apparent that the current for writing data is set to be larger than the read current.

In the embodiment, in the magneto-resistive effect element 1B$_1$, the underlying layer 2 is arranged on the leading electrode 40 side, and the metal hard mask 18 is arranged on the bit line 45$_1$ side. In the magneto-resistive effect element 1B$_2$, the metal hard mask 18 is arranged on the leading electrode 40 side, and the underlying layer 2 is arranged on the bit line 45$_2$ side. However, in the magneto-resistive effect element 1B$_1$, the metal hard mask 18 may be arranged on the leading electrode 40 side, and the underlying layer 2 may be arranged on the bit line 45$_1$ side. In the magneto-resistive effect element 1B$_2$, the underlying layer 2 may be arranged on the leading electrode 40 side, and the metal hard mask 18 may be arranged on the bit line 45$_2$ side.

In the embodiment, the magneto-resistive effect element according to the third embodiment is used as the magneto-resistive effect element of the memory cell. However, the magneto-resistive effect element according to any one of the first to sixth embodiments except for the third embodiment may be used.

In the seventh and eighth embodiments, the magneto-resistive effect element further comprises a sense current control device circuit, a driver, and a sinker which are used to control a sense current to be flowed to the magneto-resistive effect element to read information stored in the magneto-resistive effect element, as a matter of course.

Examples of the embodiment of the present invention will be described below in further detail.

FIRST EXAMPLE

As a first example of the present invention, a magneto-resistive effect element 1B according to the third embodiment shown in FIG. 3 was manufactured. As a comparative example, a structure shown in FIG. 20 was manufactured to compare spin inversion currents with each other.

The structure of a magnetic memory according to the first example will be described below along the manufacturing procedure.

As shown in FIG. 3, a TMR film, i.e., laminated films constituted by the underlying layer 2, the anti-ferromagnetic layer 4, the magnetic layer 6*a*, the nonmagnetic layer 6*b*, the magnetic layer 6*c*, the tunnel barrier layer 8, the magnetic recording layer 10, a nonmagnetic layer 11, the magnetization-pinned layer 14, the anti-ferromagnetic layer 16, a cap layer (not shown) consisting of Ru, and the metal hard mask 18 are sequentially formed on a lower electrode (not shown). The TMR element having the above configuration is used as the first example.

Figure 20:
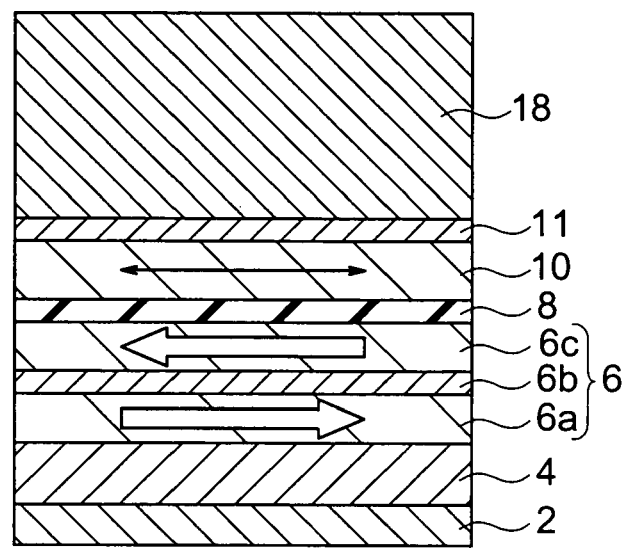
FIG. 20 is a sectional view showing the configuration of a magneto-resistive effect element according to a comparative example of the first embodiment of the present invention.

As shown in FIG. 20, a TMR film, i.e., laminated films constituted by the anti-ferromagnetic layer 4, the magnetic layer 6*a*, the nonmagnetic layer 6*b*, the magnetic layer 6*c*, the tunnel barrier layer 8, the magnetic recording layer 10, a nonmagnetic layer 11, a cap layer (not shown) consisting of Ru, and the metal hard mask 18 are sequentially formed on a lower electrode (not shown). The TMR element having the above configuration is used as a comparative example.

In this example, a lower wiring layer consists of Ta, and the underlying layer 2 consists of Ru. As the TMR film according to the first example, the anti-ferromagnetic layer 4 consisting of Ir—Mn (10 nm), the magnetization-pinned layer 6 consisting of CoFe (3 nm)/Ru (0.8 nm)/CoFe (4 nm), the tunnel barrier layer 8 consisting of AlOx (1.4 nm), the magnetic recording layer 10 consisting of CoFe (3 nm), the nonmagnetic metal layer 12 consisting of Cu (6 nm), the magnetization-pinned layer 14 consisting of CoFe (3 nm), and the anti-ferromagnetic layer 16 consisting of Ir—Mn (10 nm) were sequentially formed from the lower side. As the TMR film serving as the comparative example, the anti-ferromagnetic layer 4 consisting of Ir—Mn (10 nm), the magnetization-pinned layer 6 consisting of CoFe (3 nm)/Ru (0.8 nm)/CoFe (4 nm), the tunnel barrier layer 8 consisting of AlOx (1.4 nm), and the magnetic recording layer 10 consisting of CoFe (3 nm) were sequentially formed.

Thereafter, both the structures according to the first example and the comparative example were annealed in a magnetic field at a temperature 270° C., coated with resists, and etched. The resists were slimmed by an ozone flow at a temperature of 140° C. The Ta layers were etched with a chlorine-based gas by an RIE method by using the slimmed resists as masks. This etching was stopped to the cap layers consisting of Ru. Thereafter, the resists were peeled, and the resultant structures were milled to the tunnel barrier layer, or ferromagnetic tunnel junctions were isolated by using an RIE method.

In the junction sizes of the first example and the comparative example were 0.1×0.18 μm each. Thereafter, after an SiOx protective films were formed and coated with resists, and the resists were patterned to form resist patterns. The lower electrodes were patterned by an RIE method using the resist patterns as masks. Thereafter, the resist patterns were removed, and SiOx insulating interlayers were formed. The resultant structures were etched back to flatten the SiOx insulating interlayers, and the heads of the Ta hard mask layers on the upper side of the TMR film were exposed. Thereafter, after the resultant structures were etched by sputtering, the wiring layers were sputtered. The resultant structures were etched back to form the upper wiring layers. Thereafter, annealing was performed in a magnetic field to apply magnetic fields in the longitudinal direction of the magnetic layers.

Figure 21:
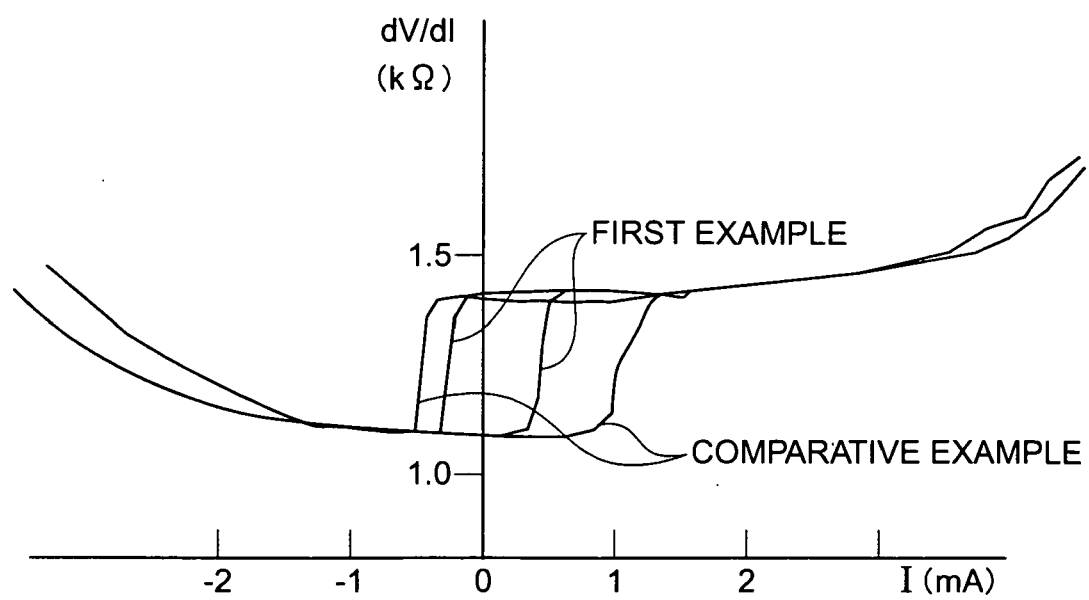
FIG. 21 is a graph showing writing characteristics (dV/dI-I curves) of the first example and a comparative example.

Currents were flowed to the structures according to the first example and the comparative example to examine milliamperes at which spins were inverted. As shown in FIG. 21, the spin was inverted at a current of 0.52 mA in the first example, and the spin was inverted at a current of 1.2 mA in the comparative example. It was understood that the structure of the example was suitable for a large-capacity memory and that writing could be performed by spin injection with a low current.

SECOND EXAMPLE

As a second example of the embodiment of the present invention, the architecture of the magnetic memory shown in FIG. 12 was manufactured as the second example of the embodiment of the present invention. A micropatterning method for a TMR element is basically the same as that of the first example. After the TMR element $1B_2$ was formed, a film for the leading electrode 40 was formed without processing the leading electrode 40 as shown in FIG. 12. Thereafter, CMP (Chemical Mechanical Polishing) was performed, and a flattening process was performed, and the TMR film of the TMR element $1B_1$ was formed.

As the substrate, a substrate with a transistor was used. In this example, a laminated film consisting of Ta/Cu/Ta was used as the leading electrode 40, an Ru layer was used as the underlying layer 2, an Ru layer was used as the cap layer, and a Ta layer was used as the hard mask 18. As the TMR film section, the anti-ferromagnetic layer 4 consisting of Pt—Mn (14 nm), the magnetization-pinned layer 6 consisting of CoFe (3 nm)/Ru (0.9 nm)/CoFe (3 nm), the tunnel barrier layer 8 consisting of AlOx (1.4 nm), the magnetic recording layer 10 consisting of CoNiFe (4 nm), the non-magnetic metal layer 12 consisting of Cu (6 nm), the magnetization-pinned layer 14 consisting of CoFe (3 nm), and the anti-ferromagnetic layer 16 consisting of Pt—Mn (14 nm) were sequentially formed from the lower side. The magneto-resistive effect element $1B_2$ had the same structure as that of the magneto-resistive effect element $1B_1$. The junction areas of the magneto-resistive effect elements $1B_1$ and $1B_2$ were set at 0.1×0.18 μm² each. After the processing, annealing in a magnetic field was performed to apply a magnetic field in the longitudinal direction of the magnetic layer of the magnetization-pinned layer.

A current was flowed to the structure according to the second example to examine milliamperes at which spins were inverted. The spin was inverted at a current of 0.49 mA in the magneto-resistive effect element $1B_2$, and the spin was inverted at a current of 0.51 mA in the magneto-resistive effect element $1B_1$. In the structure according to the example, an advantage of a large-capacity memory could be confirmed. A current pulse smaller than 0.51 mA was flowed to the TMR element, and a read speed obtained after data was written was checked. In this case, it could be confirmed that a different read time was 16 nsec, i.e., that the read speed was high, and a large-capacity and high-speed reading/writing operation could be proved.

THIRD EXAMPLE

Figure 22:
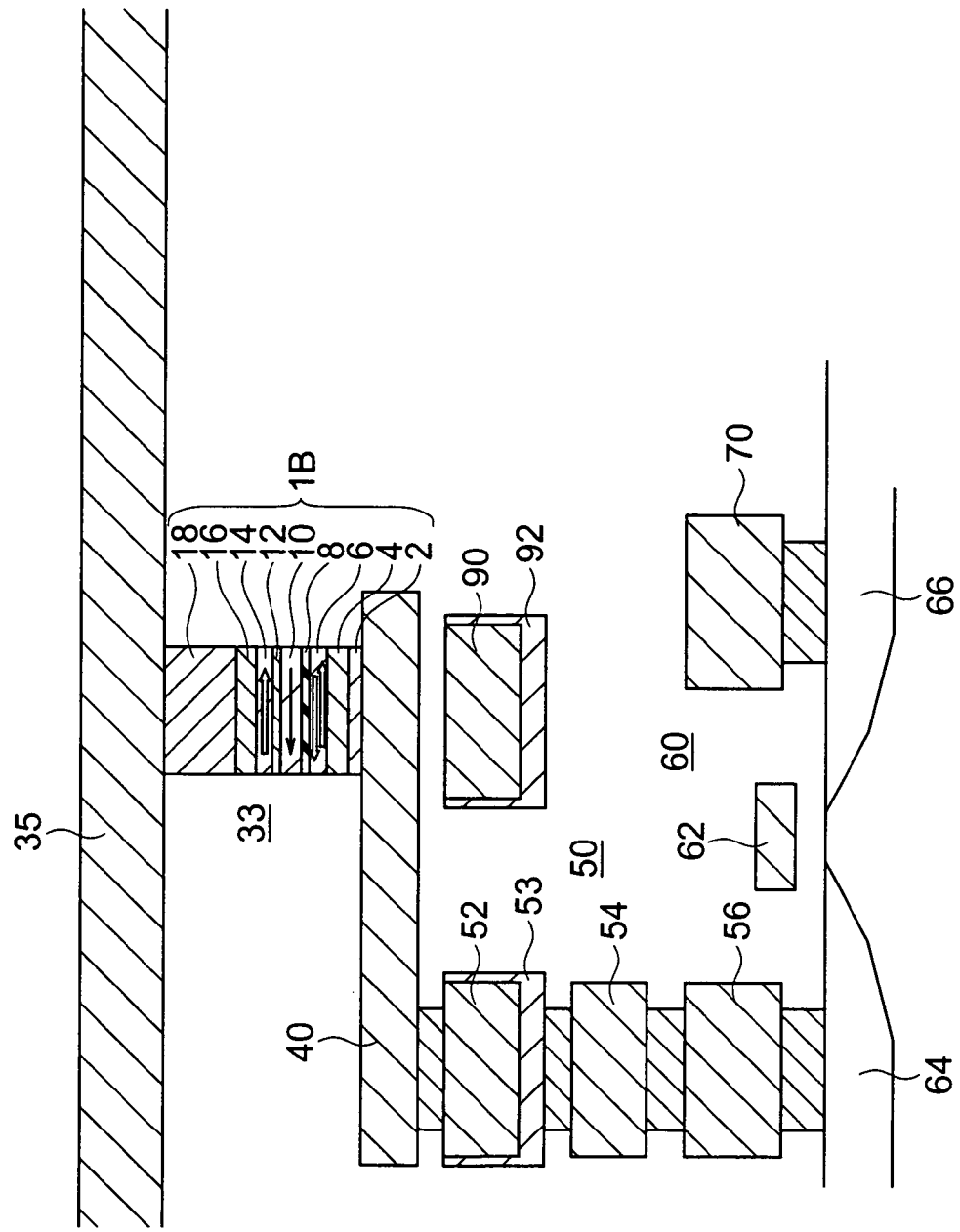
FIG. 22 is a sectional view showing the configuration of a memory cell of the magnetic memory according to the third example of the present invention.

As a third example of the embodiment of the present invention, an architecture having a structure shown in FIG. 22 was manufactured. A memory cell 33 of a magnetic memory according to the example was obtained by arranging a wiring 90 with a yoke 92 on the memory cell 30 shown in FIG. 7. The wiring 90 made it possible to achieve an architecture which could be assisted by a magnetic field induced by current. The application direction of the magnetic field was a direction of axis of easy magnetization, and the magnetic field induced by current was assisted in a desired direction of spin inversion. A micropatterning method for the TMR element 1B is basically the same as that in the first example.

A substrate with the transistor 60 was used as a substrate. In the example, an Ru layer was used as the underlying layer 2, an Ru layer was used as the cap layer, and a Ta layer was used as the hard mask 18. As the TMR film section of the TMR element, the anti-ferromagnetic layer 4 consisting of Pt—Mn (14 nm), the magnetization-pinned layer 6 consisting of CoFe (3 nm)/Ru (0.9 nm)/CoFe (3 nm), the tunnel barrier layer 8 consisting of AlOx (1.4 nm), the magnetic recording layer 10 consisting of CoNiFe (4 nm), the non-magnetic metal layer 12 consisting of Cu (6 nm), the magnetization-pinned layer 14 consisting of CoFe (3 nm), and the anti-ferromagnetic layer 16 consisting of Pt—Mn (14 nm) were sequentially formed from the lower side as in the second example. The junction area of the magneto-resistive effect element 1B was set at 0.1×0.18 μm². After the processing, annealing in a magnetic field was performed to apply a magnetic field in the longitudinal direction of the magnetic layer of the magnetization-pinned layer 14.

Figure 23:
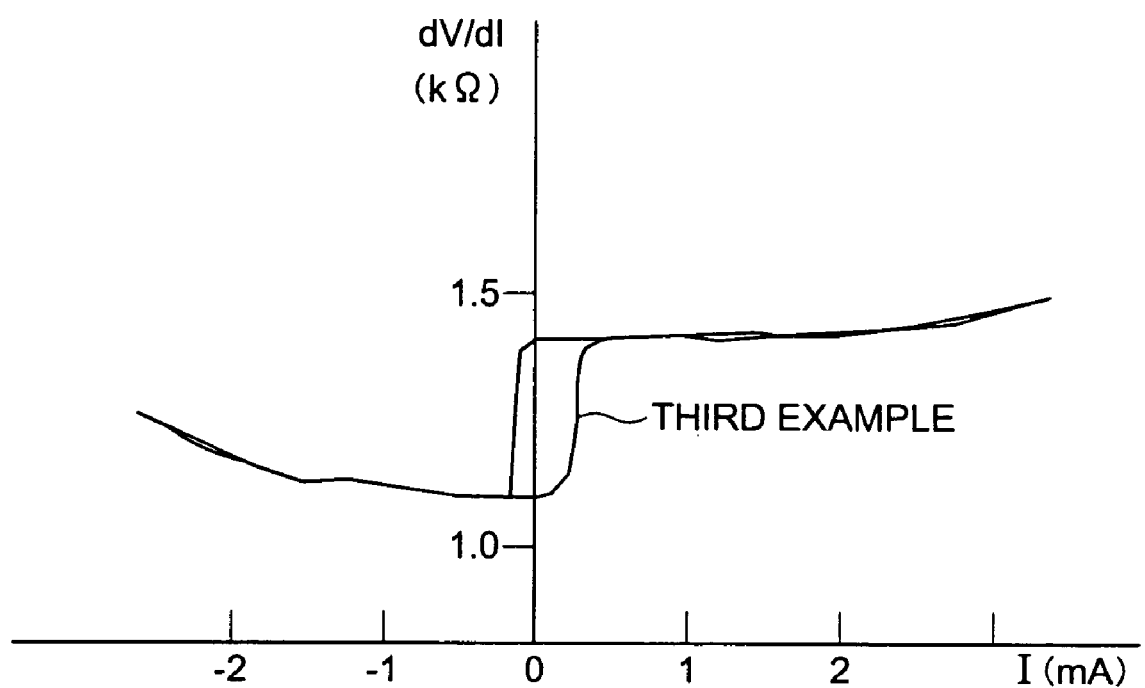
FIG. 23 is a graph showing writing characteristics (dV/dI-I curve) of the third example.

A current pulse of 0.2 mA was flowed to the wiring 90 with the yoke 92 to assist a magnetic field induced by current, and spin injection current was flowed to examine milliamperes at which a spin was inverted. As shown in FIG. 23, the spin was inverted at a current of 0.38 mA. In the structure according to the example, an advantage of a large-capacity memory could be confirmed.

FOURTH EXAMPLE

As a fourth example of the present invention, a magnetic memory using a magneto-resistive effect element (TMR element) 1E shown in FIG. 6 was manufactured. A micropatterning method for the TMR element is basically the same as that in the first example.

A laminated film consisting of Ta/Cu/Ta was used as a leading electrode on a substrate, an Ru layer was used as the underlying layer, an Ru layer was used as the cap layer, and a Ta layer was used as the hard mask. As the TMR film of the TMR element 1E, the anti-ferromagnetic layer 4 consisting of Pt—Mn (14 nm), the magnetization-pinned layer 6 consisting of CoFe (3 nm)/Ru (0.9 nm)/CoFe (4 nm), the tunnel barrier layer 8 consisting of AlOx (1.4 nm), the magnetic recording layer 10 consisting of CoNiFe (4 nm)/

Cu (1.6 nm)/CoNiFe (4 nm), the nonmagnetic metal layer 12 consisting of Cu (6 nm), the magnetization-pinned layer 14 consisting of CoFe (3 nm), and the anti-ferromagnetic layer 16 consisting of Pt—Mn (14 nm) were sequentially formed from the lower side. A ferromagnetic junction is present between the CoNiFe (4 nm) layers of the magnetic recording layer 10 through a nonmagnetic layer consisting of Cu (1.6 nm). The junction area of the TMR element 1E was set at 0.1×0.18 µm². After the processing, annealing in a magnetic field was performed to apply magnetic fields in the longitudinal directions of the magnetic layers of the magnetization-pinned layers 6 and 14.

A current was flowed to examine milliamperes at which a spin was inverted in the magnetic recording layer 10. In this case, the spin was inverted at a current of 0.3 mA. In the structure according to the example, an advantage of a large-capacity memory could be confirmed.

The embodiments of the present invention have been described above with reference to concrete examples. However, the present invention is not limited to these concrete examples. For example, the following can be included in the scope of the invention. That is, the concrete materials, film thicknesses, shapes, sizes and the like of a ferromagnetic layer, an insulating film, an anti-ferromagnetic layer, a nonmagnetic metal layer, an electrode, and the like constituting the magneto-resistive effect element are appropriately selected by a person skilled in the art to execute the present invention as described above, so that the same effect as described above can be obtained.

Similarly, the following is also included in scope of the present invention. That is, the structures, materials, shapes, and sizes of elements constituting the magnetic memory according to the present invention are appropriately selected by a person skilled in the art to execute the present invention, so that the same effect as described above can be obtained.

All magnetic memories which can be executed such that the magnetic memories described above as the embodiments of the present invention are changed in design by a person skilled in the art are also included in the scope of the invention.

As described above, a magnetic memory according to the embodiments of the present invention can perform a writing operation with low power consumption and a low current and can enhance reliability without causing element breakdown.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magneto-resistive effect element comprising:
a first magnetization-pinned layer including at least one magnetic film in which a magnetization direction is pinned;
a second magnetization-pinned layer including at least one magnetic film in which a magnetization direction is pinned;
a magnetic recording layer provided between the first magnetization-pinned layer and the second magnetization-pinned layer and including a single-layer magnetic film in which a magnetization direction is changeable by injecting spin-polarized electrons;
a first tunnel barrier layer provided between the first magnetization-pinned layer and the magnetic recording layer; and
a second tunnel barrier layer provided between the magnetic recording layer and the second magnetization-pinned layer, and having a resistance different from that of the first tunnel barrier layer;
the magnetization direction of the magnetic film of the first magnetization-pinned layer on the magnetic recording layer side being substantially opposite to the magnetization direction of the magnetic film of the second magnetization-pinned layer on the magnetic recording layer side.

2. The magneto-resistive effect element according to claim 1, wherein at least one of the first and second magnetization-pinned layers has a three-layer structure having two magnetic films and a nonmagnetic film provided between the two magnetic layers.

3. The magneto-resistive effect element according to claim 1, comprising a first anti-ferromagnetic layer which pins the magnetization direction of the first magnetization-pinned layer and a second anti-ferromagnetic layer which pins the magnetization direction of the second magnetization-pinned layer.

4. A magnetic memory comprising:
a memory cell including
a magneto-resistive effect element according to claim 1, and
a first wiring to which one end of the magneto-resistive effect element is electrically connected; and
a second wiring to which the other end of the magneto-resistive effect element is electrically connected.

5. The magnetic memory according to claim 4, wherein the memory cell comprises a selective transistor one of a source and a drain of which is connected to the first wiring.

6. The magnetic memory according to claim 4, further comprising a third wiring provided on an opposite side of the first wiring from the magneto-resistive effect element, wherein an inversion of the magnetization direction of the magnetic recording layer is assisted by a magnetic field induced by causing a current to flow in the third wiring.

7. The magnetic memory according to claim 6, wherein the third wiring is a wiring with a yoke.

8. The magnetic memory according to claim 6, wherein an application direction of the magnetic field is a direction of a magnetization easy axis of the magnetic recording layer.

9. A magnetic memory comprising:
a memory cell including
a first magneto-resistive effect element according to claim 1,
a second magneto-resistive effect element according to claim 1,
a first wiring to which one end of the first magneto-resistive effect element and one end of the second magneto-resistive effect element are electrically connected, and
a selective transistor one of a source and a drain of which is connected to the first wiring;
a second wiring to which the other end of the first magneto-resistive effect element is electrically connected; and
a third wiring to which the other end of the second magneto-resistive effect element is electrically connected,
wherein a layer arrangement of the first magneto-resistive effect element in the direction toward the second wiring from the first wiring is opposite to a layer arrangement of the second magneto-resistive effect element in the direction toward the third wiring from the first wiring.

10. The magnetic memory according to claim 9, comprising:
a first reading transistor having one end connected to the second wiring;
a second reading transistor having one end connected to the third wiring; and
a differential amplification circuit connected to the other end of the first reading transistor and the other end of the second reading transistor.

11. A magneto-resistive effect element comprising:
a first magnetization-pinned layer including at least one magnetic film in which a magnetization direction is pinned;
a second magnetization-pinned layer including at least one magnetic film in which a magnetization direction is pinned;
a magnetic recording layer provided between the first magnetization-pinned layer and the second magnetization-pinned layer and including a multi-layer structure having at least two magnetic films and a nonmagnetic film provided between the two magnetic films, in which magnetization directions are changeable by injecting spin-polarized electrons;
a first tunnel barrier layer provided between the first magnetization-pinned layer and the magnetic recording layer; and
a second tunnel barrier layer provided between the magnetic recording layer and the second magnetization-pinned layer, and having a resistance different from that of the first tunnel barrier layer,
the magnetization direction of the magnetic film of the first magnetization-pinned layer on the magnetic recording layer side being substantially opposite to the magnetization direction of the magnetic film of the second magnetization-pinned layer on the magnetic recording layer side, and the magnetic recording layer having a ferromagnetic interaction between the magnetic films arranged through the nonmagnetic film.

12. The magneto-resistive effect element according to claim 11, wherein the strength of the ferromagnetic interaction between the magnetic films arranged through the nonmagnetic film is 2000 Oe or less.

13. The magneto-resistive effect element according to claim 11, wherein at least one of the first and second magnetization-pinned layers has a three-layer structure having two magnetic films and a nonmagnetic film provided between the two magnetic layers.

14. The magneto-resistive effect element according to claim 11, comprising a first anti-ferromagnetic layer which pins the magnetization direction of the first magnetization-pinned layer and a second anti-ferromagnetic layer which pins the magnetization direction of the second magnetization-pinned layer.

15. A magnetic memory comprising:
a memory cell including
a magneto-resistive effect element according to claim 11, and
a first wiring to which one end of the magneto-resistive effect element is electrically connected; and
a second wiring to which the other end of the magneto-resistive effect element is electrically connected.

16. The magnetic memory according to claim 15, wherein the memory cell comprises a selective transistor one of a source and a drain of which is connected to the first wiring.

17. The magnetic memory according to claim 15, further comprising:
a third wiring provided on an opposite side of the first wiring from the magneto-resistive effect element, wherein an inversion of the magnetization direction of the magnetic recording layer is assisted by a magnetic field induced by causing a current to flow in the third wiring.

18. The magnetic memory according to claim 17, wherein the third wiring is a wiring with a yoke.

19. The magnetic memory according to claim 17, wherein an application direction of the magnetic field is a direction of a magnetization easy axis of the magnetic recording layer.

20. A magnetic memory comprising:
a memory cell including
a first magneto-resistive effect element according to claim 11,
a second magneto-resistive effect element according to claim 11,
a first wiring to which one end of the first magneto-resistive effect element and one end of the second magneto-resistive effect element are electrically connected, and
a selective transistor one of a source and a drain of which is connected to the first wiring;
a second wiring to which the other end of the first magneto-resistive effect element is electrically connected; and
a third wiring to which the other end of the second magneto-resistive effect element is electrically connected,
wherein a layer arrangement of the first magneto-resistive effect element in the direction toward the second wiring from the first wiring is opposite to a layer arrangement of the second magneto-resistive effect element in the direction toward the third wiring from the first wiring.

21. The magnetic memory according to claim 20, comprising:
a first reading transistor having one end connected to the second wiring;
a second reading transistor having one end connected to the third wiring; and
a differential amplification circuit connected to the other end of the first reading transistor and the other end of the second reading transistor.

22. A magneto-resistive effect element comprising:
a first magnetization-pinned layer including at least one magnetic film in which a magnetization direction is pinned;
a second magnetization-pinned layer including at least one magnetic film in which a magnetization direction is pinned;
a magnetic recording layer provided between the first magnetization-pinned layer and the second magnetization-pinned layer and having a two-layer structure having a soft magnetic film and a ferromagnetic film or a three-layer structure having two ferromagnetic films and a soft magnetic film provided between the two ferromagnetic films, and in which a magnetization direction is changeable by injecting spin-polarized electrons;
a first tunnel barrier layer provided between the first magnetization-pinned layer and the magnetic recording layer; and
a second tunnel barrier layer provided between the magnetic recording layer and the second magnetization-pinned layer, and having a resistance different from that of the first tunnel barrier layer, the magnetization direction of the magnetic film of the first magnetization-pinned layer on the magnetic recording layer side being substantially opposite to the magnetization direction of the magnetic film of the second magnetization-pinned layer on the magnetic recording layer side.

23. The magneto-resistive effect element according to claim 22, wherein at least one of the first and second magnetization-pinned layers has a three-layer structure having two magnetic films and a nonmagnetic film provided between the two magnetic layers.

24. The magneto-resistive effect element according to claim 22, comprising a first anti-ferromagnetic layer which pins the magnetization direction of the first magnetization-pinned layer and a second anti-ferromagnetic layer which pins the magnetization direction of the second magnetization-pinned layer.

25. A magnetic memory comprising:
a memory cell including
a magneto-resistive effect element according to claim 22, and
a first wiring to which one end of the magneto-resistive effect element is electrically connected; and
a second wiring to which the other end of the magneto-resistive effect element is electrically connected.

26. The magnetic memory according to claim 25, wherein the memory cell comprises a selective transistor one of a source and a drain of which is connected to the first wiring.

27. The magnetic memory according to claim 25, further comprising:
a third wiring provided on an opposite side of the first wiring from the magneto-resistive effect element, wherein an inversion of the magnetization direction of the magnetic recording layer is assisted by a magnetic field induced by causing a current to flow in the third wiring.

28. The magnetic memory according to claim 27, wherein the third wiring is a wiring with a yoke.

29. The magnetic memory according to claim 27, wherein an application direction of the magnetic field is a direction of a magnetization easy axis of the magnetic recording layer.

30. A magnetic memory comprising:
a memory cell including
a first magneto-resistive effect element according to claim 22,
a second magneto-resistive effect element according to claim 22,
a first wiring to which one end of the first magneto-resistive effect element and one end of the second magneto-resistive effect element are electrically connected, and
a selective transistor one of a source and a drain of which is connected to the first wiring;
a second wiring to which the other end of the first magneto-resistive effect element is electrically connected; and
a third wiring to which the other end of the second magneto-resistive effect element is electrically connected;
wherein a layer arrangement of the first magneto-resistive effect element in the direction toward the second wiring from the first wiring is opposite to a layer arrangement of the second magneto-resistive effect element in the direction toward the third wiring from the first wiring.

31. The magnetic memory according to claim 30, comprising:
a first reading transistor having one end connected to the second wiring;
a second reading transistor having one end connected to the third wiring; and
a differential amplification circuit connected to the other end of the first reading transistor and the other end of the second reading transistor.

32. A magneto-resistive effect element comprising:
a first magnetization-pinned layer including at least one magnetic film in which a magnetization direction is pinned;
a second magnetization-pinned layer including at least one magnetic film in which a magnetization direction is pinned;
a magnetic recording layer provided between the first magnetization-pinned layer and the second magnetization-pinned layer and including a single-layer magnetic film in which a magnetization direction is changeable by injecting spin-polarized electrons;
a tunnel barrier layer provided between the first magnetization-pinned layer and the magnetic recording layer; and
a nonmagnetic metal layer provided between the magnetic recording layer and the second magnetization-pinned layer, and formed of gold or silver,
the magnetization direction of the magnetic film of the first magnetization-pinned layer on the magnetic recording layer side being substantially opposite to the magnetization direction of the magnetic film of the second magnetization-pinned layer on the magnetic recording layer side.

33. The magneto-resistive effect element according to claim 32, wherein at least one of the first and second magnetization-pinned layers has a three-layer structure having two magnetic films and a nonmagnetic film provided between the two magnetic layers.

34. The magneto-resistive effect element according to claim 32, comprising a first anti-ferromagnetic layer which pins the magnetization direction of the first magnetization-pinned layer and a second anti-ferromagnetic layer which pins the magnetization direction of the second magnetization-pinned layer.

35. A magnetic memory comprising:
a memory cell including
a magneto-resistive effect element according to claim 32, and
a first wiring to which one end of the magneto-resistive effect element is electrically connected; and
a second wiring to which the other end of the magneto-resistive effect element is electrically connected.

36. The magnetic memory according to claim 35, wherein the memory cell comprises a selective transistor one of a source and a drain of which is connected to the first wiring.

37. The magnetic memory according to claim 35, further comprising:
a third wiring provided on an opposite side of the first wiring from the magneto-resistive effect element, wherein an inversion of the magnetization direction of the magnetic recording layer is assisted by a magnetic field induced by causing a current to flow in the third wiring.

38. The magnetic memory according to claim 37, wherein the third wiring is a wiring with a yoke.

39. The magnetic memory according to claim 37, wherein an application direction of the magnetic field is a direction of a magnetization easy axis of the magnetic recording layer.

40. A magnetic memory comprising:
a memory cell including
a first magneto-resistive effect element according to claim 32,
a second magneto-resistive effect element according to claim 32,
a first wiring to which one end of the first magneto-resistive effect element and one end of the second magneto-resistive effect element are electrically connected, and
a selective transistor one of a source and a drain of which is connected to the first wiring;
a second wiring to which the other end of the first magneto-resistive effect element is electrically connected; and
a third wiring to which the other end of the second magneto-resistive effect element is electrically connected,
wherein a layer arrangement of the first magneto-resistive effect element in the direction toward the second wiring from the first wiring is opposite to a layer arrangement of the second magneto-resistive effect element in the direction toward the third wiring from the first wiring.

41. The magnetic memory according to claim 40, comprising:
a first reading transistor having one end connected to the second wiring;
a second reading transistor having one end connected to the third wiring; and
a differential amplification circuit connected to the other end of the first reading transistor and the other end of the second reading transistor.

42. A magneto-resistive effect element comprising:
a first magnetization-pinned layer including at least one magnetic film in which a magnetization direction is pinned;
a second magnetization-pinned layer including at least one magnetic film in which a magnetization direction is pinned;
a magnetic recording layer provided between the first magnetization-pinned layer and the second magnetization-pinned layer and including a multi-layer structure having at least two magnetic films and a nonmagnetic film provided between the two magnetic films, in which magnetization directions are changeable by injecting spin-polarized electrons;
a tunnel barrier layer provided between the first magnetization-pinned layer and the magnetic recording layer; and
a nonmagnetic metal layer provided between the magnetic recording layer and the second magnetization-pinned layer,
the magnetization direction of the magnetic film of the first magnetization-pinned layer on the magnetic recording layer side being substantially opposite to the magnetization direction of the magnetic film of the second magnetization-pinned layer on the magnetic recording layer side, and the magnetic recording layer having a ferromagnetic interaction between the magnetic films arranged through the nonmagnetic film.

43. The magneto-resistive effect element according to claim 42, wherein the strength of the ferromagnetic interaction between the magnetic films arranged through the nonmagnetic film is 2000 Oe or less.

44. The magneto-resistive effect element according to claim 42, wherein at least one of the first and second magnetization-pinned layers has a three-layer structure having two magnetic films and a nonmagnetic film provided between the two magnetic layers.

45. The magneto-resistive effect element according to claim 42, comprising a first anti-ferromagnetic layer which pins the magnetization direction of the first magnetization-pinned layer and a second anti-ferromagnetic layer which pins the magnetization direction of the second magnetization-pinned layer.

46. A magnetic memory comprising:
a memory cell including
a magneto-resistive effect element according to claim 42, and
a first wiring to which one end of the magneto-resistive effect element is electrically connected; and
a second wiring to which the other end of the magneto-resistive effect element is electrically connected.

47. The magnetic memory according to claim 46, wherein the memory cell comprises a selective transistor one of a source and a drain of which is connected to the first wiring.

48. The magnetic memory according to claim 46, further comprising:
a third wiring provided on an opposite side of the first wiring from the magneto-resistive effect element, wherein an inversion of the magnetization direction of the magnetic recording layer is assisted by a magnetic field induced by causing a current to flow in the third wiring.

49. The magnetic memory according to claim 48, wherein the third wiring is a wiring with a yoke.

50. The magnetic memory according to claim 48, wherein an application direction of the magnetic field is a direction of a magnetization easy axis of the magnetic recording layer.

51. A magnetic memory comprising:
a memory cell including
a first magneto-resistive effect element according to claim 42,
a second magneto-resistive effect element according to claim 42,
a first wiring to which one end of the first magneto-resistive effect element and one end of the second magneto-resistive effect element are electrically connected, and
a selective transistor one of a source and a drain of which is connected to the first wiring;
a second wiring to which the other end of the first magneto-resistive effect element is electrically connected; and
a third wiring to which the other end of the second magneto-resistive effect element is electrically connected,
wherein a layer arrangement of the first magneto-resistive effect element in the direction toward the second wiring from the first wiring is opposite to a layer arrangement of the second magneto-resistive effect element in the direction toward the third wiring from the first wiring.

52. The magnetic memory according to claim 51, comprising:
a first reading transistor having one end connected to the second wiring;
a second reading transistor having one end connected to the third wiring; and
a differential amplification circuit connected to the other end of the first reading transistor and the other end of the second reading transistor.

53. A magneto-resistive effect element comprising:
a first magnetization-pinned layer including at least one magnetic film in which a magnetization direction is pinned;
a second magnetization-pinned layer including at least one magnetic film in which a magnetization direction is pinned;
a magnetic recording layer provided between the first magnetization-pinned layer and the second magnetization-pinned layer and having a two-layer structure having a soft magnetic film and a ferromagnetic film or a three-layer structure having two ferromagnetic films and a soft magnetic film provided between the two ferromagnetic films, and in which a magnetization direction is changeable by injecting spin-polarized electrons;
a tunnel barrier layer provided between the first magnetization-pinned layer and the magnetic recording layer; and
a nonmagnetic metal layer provided between the magnetic recording layer and the second magnetization-pinned layer,
the magnetization direction of the magnetic film of the first magnetization-pinned layer on the magnetic recording layer side being substantially opposite to the magnetization direction of the magnetic film of the second magnetization-pinned layer on the magnetic recording layer side.

54. The magneto-resistive effect element according to claim 53, wherein at least one of the first and second magnetization-pinned layers has a three-layer structure having two magnetic films and a nonmagnetic film provided between the two magnetic layers.

55. The magneto-resistive effect element according to claim 53, comprising a first anti-ferromagnetic layer which pins the magnetization direction of the first magnetization-pinned layer and a second anti-ferromagnetic layer which pins the magnetization direction of the second magnetization-pinned layer.

56. A magnetic memory comprising:
a memory cell including
a magneto-resistive effect element according to claim 53, and
a first wiring to which one end of the magneto-resistive effect element is electrically connected; and
a second wiring to which the other end of the magneto-resistive effect element is electrically connected.

57. The magnetic memory according to claim 56, wherein the memory cell comprises a selective transistor one of a source and a drain of which is connected to the first wiring.

58. The magnetic memory according to claim 56, further comprising:
a third wiring provided on an opposite side of the first wiring from the magneto-resistive effect element, wherein an inversion of the magnetization direction of the magnetic recording layer is assisted by a magnetic field induced by causing a current to flow in the third wiring.

59. The magnetic memory according to claim 58, wherein the third wiring is a wiring with a yoke.

60. The magnetic memory according to claim 58, wherein an application direction of the magnetic field is a direction of a magnetization easy axis of the magnetic recording layer.

61. A magnetic memory comprising:
a memory cell including
a first magneto-resistive effect element according to claim 53,
a second magneto-resistive effect element according to claim 53,
a first wiring to which one end of the first magneto-resistive effect element and one end of the second magneto-resistive effect element are electrically connected, and
a selective transistor one of a source and a drain of which is connected to the first wiring;
a second wiring to which the other end of the first magneto-resistive effect element is electrically connected; and
a third wiring to which the other end of the second magneto-resistive effect element is electrically connected,
wherein a layer arrangement of the first magneto-resistive effect element in the direction toward the second wiring from the first wiring is opposite to a layer arrangement of the second magneto-resistive effect element in the direction toward the third wiring from the first wiring.

62. The magnetic memory according to claim 61, comprising:
a first reading transistor having one end connected to the second wiring;
a second reading transistor having one end connected to the third wiring; and
a differential amplification circuit connected to the other end of the first reading transistor and the other end of the second reading transistor.

* * * * *